(12) United States Patent
Palatov

(10) Patent No.: US 12,136,739 B2
(45) Date of Patent: Nov. 5, 2024

(54) BATTERY MODULE WITH SERIES CONNECTED CELLS, INTERNAL RELAYS AND INTERNAL BATTERY MANAGEMENT SYSTEM

(71) Applicant: Dennis Palatov, Portland, OR (US)

(72) Inventor: Dennis Palatov, Portland, OR (US)

(73) Assignee: Modular Battery Technologies, Inc., Portland, OR (US)

( * ) Notice: Subject to any disclaimer, the term of this patent is extended or adjusted under 35 U.S.C. 154(b) by 0 days.

(21) Appl. No.: 18/540,476

(22) Filed: Dec. 14, 2023

(65) Prior Publication Data

US 2024/0186629 A1 Jun. 6, 2024

Related U.S. Application Data

(62) Division of application No. 17/141,125, filed on Jan. 4, 2021, now Pat. No. 11,469,470.

(51) Int. Cl.
*H01M 50/204* (2021.01)
*G01R 31/3835* (2019.01)
*H01M 10/42* (2006.01)
*H01M 10/48* (2006.01)
*H01M 50/502* (2021.01)

(52) U.S. Cl.
CPC ...... *H01M 50/204* (2021.01); *G01R 31/3835* (2019.01); *H01M 10/425* (2013.01); *H01M 10/482* (2013.01); *H01M 10/486* (2013.01); *H01M 50/502* (2021.01); *H01M 2010/4271* (2013.01)

(58) Field of Classification Search
CPC .. H01M 50/204; H01M 50/50; H01M 10/425; H01M 10/482; H01M 10/486; H01M 2010/4271; G01R 31/3835
See application file for complete search history.

(56) References Cited

U.S. PATENT DOCUMENTS

| | | | |
|---|---|---|---|
| 2005/0024015 A1* | 2/2005 | Houldsworth | H02J 7/0016 320/119 |
| 2008/0183914 A1* | 7/2008 | Gorbold | G06F 13/4247 710/26 |
| 2009/0130541 A1* | 5/2009 | Emori | H02J 7/0019 429/61 |
| 2015/0295430 A1* | 10/2015 | Wright | H02J 7/00047 307/43 |
| 2017/0179543 A1* | 6/2017 | Camp | H02J 7/0018 |
| 2019/0173323 A1* | 6/2019 | Hosseini | H01M 10/425 |

* cited by examiner

*Primary Examiner* — Alexander Usyatinsky

(74) *Attorney, Agent, or Firm* — Mohr Intellectual Property Law Solutions, PC

(57) ABSTRACT

A battery cell monitoring and conditioning circuit is disclosed to facilitate low cost manufacture of battery modules comprising a plurality of series connected cells. A battery management system utilizing a plurality of series connected cell monitoring and conditioning circuits is disclosed. Methods are provided for operating the disclosed circuits.

3 Claims, 20 Drawing Sheets

BATTERY MODULE WITH SERIES CONNECTED CELLS, INTERNAL RELAYS AND INTERNAL BATTERY MANAGEMENT SYSTEM

PRIORITY CLAIM

This application is a Divisional of the co-pending application LOW COST BATTERY CELL MONITORING CIRCUIT, having Ser. No. 18/092,806 and filed Jan. 3 2023, which is a Continuation In Part of application BATTERY MODULE WITH SERIES CONNECTED CELLS, INTERNAL RELAYS AND INTERNAL BATTERY MANAGEMENT SYSTEM, having Ser. No. 17/182,072 and filed on Feb. 22, 2021, now U.S. Pat. No. 11,575,270 issued Feb. 7, 2023, which is a Continuation In Part of application BATTERY MODULE WITH SERIES CONNECTED CELLS, INTERNAL RELAYS AND INTERNAL BATTERY MANAGEMENT SYSTEM, having Ser. No. 17/141,125 and filed on Jan. 4, 2021, now U.S. Pat. No. 11,469,470 issued Oct. 11, 2022. Both of the above listed applications are incorporated by reference herein in their entirety. This application is related to co-pending application HIGH VOLTAGE BATTERY MODULE WITH SERIES CONNECTED CELLS AND INTERNAL RELAYS having Ser. No. 17/086,865, which is incorporated herein by reference.

BACKGROUND OF THE INVENTION

There is a rapidly growing demand for converting a wide variety of vehicle types to electric propulsion. In order to deliver the best performance and efficiency, the electric drivetrains of such vehicles need to operate at a direct current (DC) high voltage. Systems operating at a nominal 400V DC are now common, and higher performance designs using 800V DC and above are being put into service.

The battery packs to power such systems are increasing in capacity. Packs of over 70 KWh are now common, and some can deliver over 2,000 A of current. Such levels of power can present many life-threatening hazards both during ordinary assembly and service operations, as well as rescue operations by emergency personnel when electric vehicles are involved in a crash or other adverse event.

Exposure to moisture through condensation, precipitation, or accidental submersion can cause a short in the pack and lead to a fire or explosion.

Large capacity packs typically require a plurality of individual small cells, groups of which are connected in parallel to achieve desired current capability, and multiple groups are then connected in series to achieve the desired voltage. Because a large number of cells is typically needed, resulting in substantial weight and bulk, vehicle battery packs are often constructed of modules. A typical known battery module design is a fraction of a pack, sized to facilitate handling, and often having a module voltage that is considered to be non-hazardous in contact with human skin, below approximately 50V, although some higher-voltage modules are known.

A new trend in automotive battery design, exemplified by Tesla and others, is to move away from modular construction and create monolithic battery packs, comprised directly of cells and meant to be non-serviceable. While this may be practical in mainstream automotive applications, in high performance vehicles which see severe use as part of ordinary operation, this approach is undesirable. Such vehicles experience regular shock loads and often crash damage. They require frequent service, repair and major parts replacement as part of ordinary use. A monolithic non-serviceable battery pack runs counter to these requirements.

In modular packs known in the art, the lower-voltage modules are commonly connected in series within the pack, to achieve the desired pack voltage. A pack typically has an enclosure and safety devices such as relays, fuses, battery management system, current sensing devices, isolation monitoring devices, and the like, contained within the enclosure. Typically, the safety devices are external to the modules and only one set of safety devices is shared by all the modules in the pack, to reduce cost and manufacturing complexity. These features keep the overall pack safe as long as it is not opened for service and its integrity is not compromised by an accident or other adverse circumstance such as water ingress.

While individual modules known in the art may have a lower voltage than the overall pack, they feature groups of cells connected in parallel and therefore have a large current capability, typically equal to the desired current capability of the overall pack. This characteristic makes it impractical to add relays to each module, due to expense of high-current relays and increased resistance that would add up when multiple modules are connected in series. As a result, modules known in the art have external terminals that are always connected to the cells comprising the module. With large current capability, a short across the external terminals can result in very large amount of energy being released and carries a high risk of fire, serious injury, as well as potential damage to the module.

While not commonly practiced in vehicle battery packs, connecting high voltage modules in parallel is known in the art. In U.S. Pat. No. 10,333,328 to Horn et al., Horn teaches a multi-battery charging station, connecting a plurality of batteries in parallel. Horn teaches a diode or electrical switch within each battery to manage selective connection of each battery to the common power bus for charging. The objective of the invention taught by Hom is to provide a method of connecting multiple batteries having different states of charge to a common power bus. Horn does not contemplate the safe handling of individual batteries, and therefore does not anticipate isolating both external terminals from the cells within a battery. Hom does not contemplate the internal structure of each battery from a safety perspective. However, the method taught by Horn of managing dissimilar states of charge of parallel connected batteries is an example of known methods in the art for managing such conditions.

A further drawback of module or pack construction that utilizes groups of cells connected in parallel is the fact that if one cell in such group develops an internal short, which is a known failure mode resulting from dendrite growth. The full current of all the other cells in the group will flow through the failed cell. This can lead to rapid overheating and a resulting explosion or fire. In order to mitigate this risk, individual cells are typically connected to a common bus bar by means of fusible links. The fusible links have a resistance that causes heat to be generated as current is increased. Once enough heat is generated to melt the link, the connection is broken and the current into the failed cell is permanently interrupted. A key drawback of this approach is that in ordinary use, the inherent resistance of the fusible links leads to unwanted heat generation and overall energy loss in the pack when operating at high current levels.

Another undesirable effect of a plurality of cells connected in parallel within a module is that if one of the cells develops excessive self-discharge, which is a known defect, then all the cells in parallel with it will discharge through the defective cell over time. This will reduce the state of charge of the entire group, as a percentage of maximum. Because multiple parallel groups are typically connected in series to form a pack, the overall pack usable capacity at any given time, as a percentage of maximum, is limited by the state of charge of the lowest group. This is due to the fact that energy is removed at the same rate from all the series connected groups of parallel cells.

Over-discharging the lowest group will lead to permanent damage of the group and therefore the entire pack. Discharge must consequently be stopped when lowest allowable state of charge of the lowest group is reached, even though the other groups may still retain higher state of charge. In this way, a single defective cell in a pack constructed according to methods currently practiced in the art can result in effectively degrading the capacity of the entire pack. Servicing such packs is hazardous and requires specialized training and equipment and is usually not practical.

As commonly practiced in the art, vehicle pack design is an engineering tradeoff of cost, manufacturing efficiency, and safety. Because cost and manufacturing efficiency are the highest priorities, safety is mostly considered in the context of a pack when installed in a vehicle and in ordinary use. Vehicle battery packs known in the art are extremely hazardous when opened for service or compromised in a crash or other adverse event. In those circumstances handling of the packs requires highly trained personnel and specialized equipment to prevent potentially extensive damage, injury, or even death.

There is a demand to provide electric propulsion for a broad range of high performance vehicles such as off-road, recreational, light marine and light aircraft. Such vehicles see extreme use in ordinary operation, involving frequent crashes and requiring extensive service. Therefore, the designs and priorities employed in construction of mainstream automotive battery packs are not practical in such applications.

What is needed in the arts of vehicle batteries is a vehicle battery module design that is safe to handle without specialized training or equipment, does not create a hazard when compromised by an adverse event, allows economical and practical construction of high voltage, high current battery packs, provides for graceful degradation of the assembled pack, allows for easy and economical pack service without specialized training and equipment, and minimizes risk of fire and energy loss in operation.

In addition to being safe to handle, it is necessary for such a vehicle battery module to be robust and readily produced with commonly available materials and manufacturing techniques.

SUMMARY OF THE INVENTION

A first objective of the present invention is to provide a high voltage battery module suitable for use in vehicles that is robust in order to endure rough handling in operation, storage and transport.

A second objective of the present invention is to provide a battery module design that can be readily and cost effectively constructed utilizing commonly available materials and mass production methods.

To achieve the objectives, a battery module of the present invention comprises an enclosure containing a plurality of series connected cells which are electrically isolated from the enclosure. The series connected cells may be connected as one continuous string, or as a plurality of independent series connected strings contained within same enclosure.

A first printed circuit board assembly (PCBA) comprising one or more cell monitoring and conditioning circuits is provided. In some embodiments, the first PCBA may also comprise cell interconnect means. In other embodiments the cells may be interconnected by wires. A plurality of resistors, electrically connected to first PCBA, are provided to facilitate cell balancing, and also heating of the cells when desired. A second PCBA comprising additional cell interconnects may be utilized in some embodiments.

The portion of the enclosure containing the plurality of series connected cells and the first PCBA may be encapsulated in some embodiments. In such embodiments, the encapsulant used may be of any known type including a thermally conductive liquid, a liquid that is cured to a solid, and the like.

An external interface PCBA is provided. In many embodiments the external interface PCBA may be separate from the first PCBA and/or the second PCBA, with electrical and data connections made by means of any known type of connector. Other embodiments are possible wherein the external interface PCBA is physically integrated with the first and/or second PCBA.

The external interface PCBA comprises a positive and a negative electrical terminal, both said terminals being electrically isolated from said enclosure, and also from said plurality of cells. A first normally-open electrical relay is provided to electrically connect the positive side of the series connected cells to the positive terminal. A second normally-open electrical relay is provided to connect the negative side of the series connected cells to the negative terminal. Many types of relays are known in the art, including electromechanical and solid state.

In embodiments wherein a plurality of series connected cell groups is contained within same enclosure, additional relays may be provided to individually connect each group of series connected cells to said positive and negative terminals. In such embodiments, additional relays may be further provided to connect the separate groups of series connected cells into a continuous group of series connected cells by connecting the individual groups in series.

The external interface PCBA further comprises a connection means to an external control bus, a battery management system (BMS) circuit, and data interconnect means for communication between BMS circuit and cell conditioning circuits on the first PCBA.

In many embodiments the external interface PCBA will be a serviceable component, contained in a separate part of the enclosure that is not encapsulated.

A method is disclosed for manufacturing and assembling the module of the present invention using know mass-production processes.

A cost-effective cell monitoring and conditioning circuit is disclosed.

BRIEF DESCRIPTION OF THE DRAWINGS

The present invention is described herein in the following drawings. The components in the drawings are not necessarily to scale relative to each other. Like reference, numerals designate corresponding parts throughout the several views.

DETAILED DESCRIPTION

Figure 1:
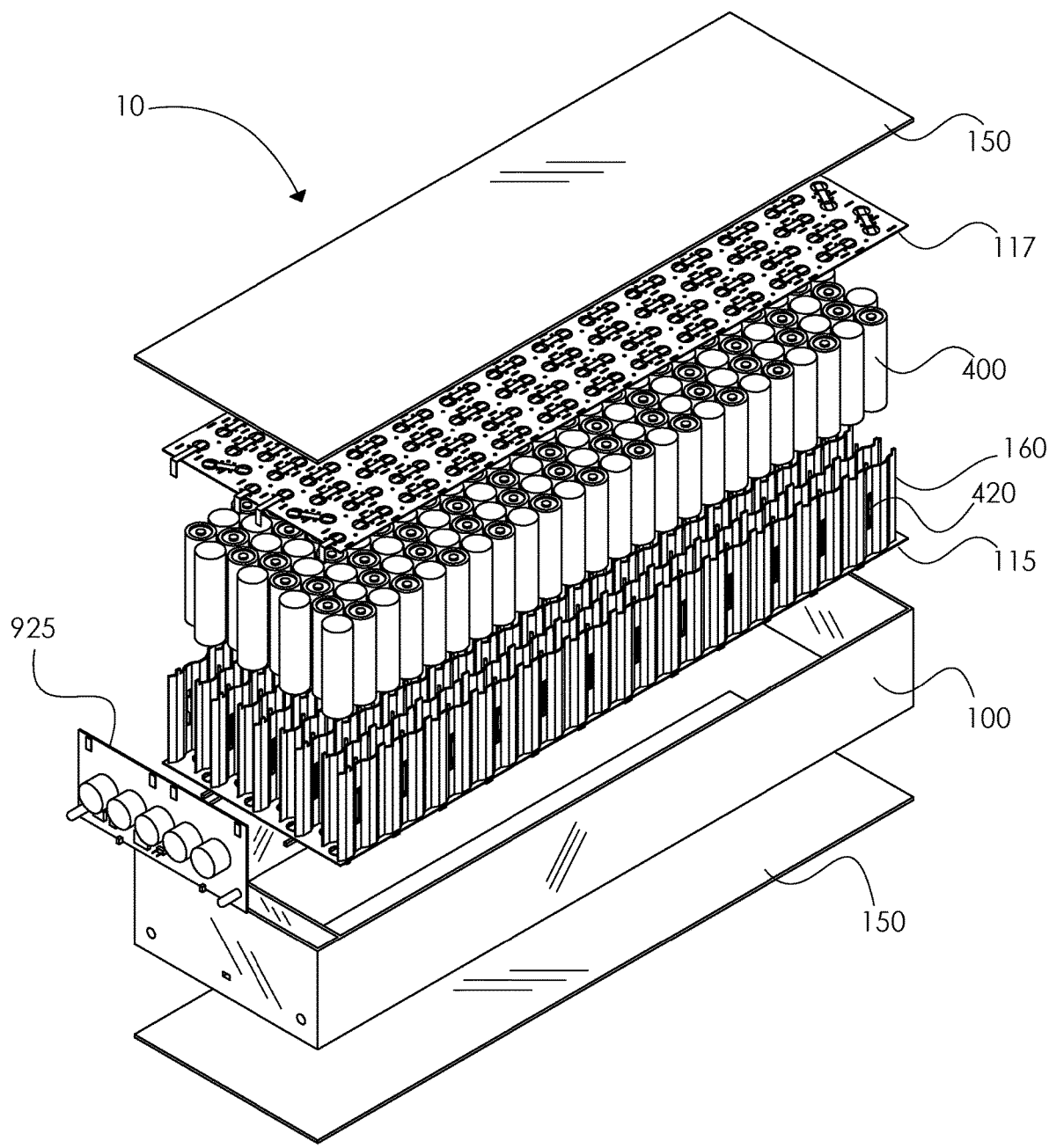
FIG. 1 is an exploded view of a representative embodiment of the present invention utilizing cylindrical cells.

An embodiment of the present invention utilizing cylindrical cells is illustrated in FIG. 1. The illustrated embodiment is not limiting, other embodiments utilizing different shapes of cells, such as prismatic or pouch type, shall become apparent to those skilled in the art based on the disclosures made herein.

The disclosed systems and methods for manufacturing a battery module 10 will become better understood through review of the following detailed description in conjunction with the figures. The detailed description and figures provide examples of the various inventions described herein. Those skilled in the art will understand that the disclosed examples may be varied, modified, and altered without departing from the scope of the inventions described herein. Many variations are contemplated for different applications and design considerations, however, for the sake of brevity, each and every contemplated variation is not individually described in the following detailed description.

Throughout the following detailed description, a variety of examples for systems and methods for the battery module 10 are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

The following definitions apply herein, unless otherwise indicated.

"Substantially" means to be more-or-less conforming to the particular dimension, range, shape, concept, or other aspect modified by the term, such that a feature or component need not conform exactly. For example, a "substantially cylindrical" object means that the object resembles a cylinder, but may have one or more deviations from a true cylinder.

"Comprising," "including," and "having" (and conjugations thereof) are used interchangeably to mean including but not necessarily limited to, and are open-ended terms not intended to exclude additional, elements or method steps not expressly recited.

Terms such as "first", "second", and "third" are used to distinguish or identify various members of a group, or the like, and are not intended to denote a serial, chronological, or numerical limitation.

"Coupled" means connected, either permanently or releasably, whether directly or indirectly through intervening components.

"Electrically coupled", "electrically connected" means circuit elements connected in a way to enable conduction of electrical current between the elements.

"Connector", "electrical connector" means a structure or device to electrically couple circuit elements in a way that is releasable.

"Interconnect", "electrical interconnect" means a structure or device to electrically couple circuit elements in a way that is not releasable.

"Communicatively coupled" means that an electronic device is in communication with another electronic device for the purpose of transmission of electronic messages, either wirelessly or with a connector, whether directly or indirectly through a communication network.

"Controllably coupled" means that an electronic device controls operation of another electronic device.

"PCBA" means a printed circuit board assembly, comprising a non-conductive substrate, one or more etched electrically conductive traces for electrically coupling circuit elements, and one or more electrical circuit elements which may be integrated circuits, relays, cell interconnects and the like.

"Resistor" means an electrical circuit element that offers resistance to electrical current, thereby converting electrical energy into thermal energy, for the purpose of dissipating said electrical energy, or for the purpose of heating adjacent components. A resistor may be constructed from wire, film, coating on a substrate, a transistor operated in linear region, an array of transistors, or any other known means. Operation of a transistor in linear region creates the effect of a controlled resistance to current flowing across the transistor and is well known in the art of transistor design. In some embodiments a resistor may be incorporated into the housing of a battery cell. In other embodiments a resistor may be incorporated in an integrated circuit (IC).

"Resistor switch" within the context of the present invention means specifically an electrical switch, which may be a transistor, to electrically connect a resistor in parallel with a single battery cell, so that electrical current may flow from the battery through the resistor, thereby converting a portion of the electrical energy stored in the cell into thermal energy. In some embodiments, resistor switch and resistor may be the same element implemented as a transistor operated in linear region.

"Mechanical alignment structure" is a system of mechanically retaining and aligning components such as cells, resistors, PCBAs and the like, with respect to each other, during manufacture, assembly and in use. A mechanical alignment structure may have any necessary shape for its function in a specific embodiment and may be fabricated by any available means from any available material, such as metal stamping, plastic injection molding, and the like.

"Cell", "battery cell" refers to a single anode and cathode separated by electrolyte used to produce a voltage and current. A battery module of the present invention comprises one or more groups of cells connected in series within the group. Cells may be cylindrical, prismatic, pouch, or any other type. Cells may be of Lithium-Ion or any other chemical type.

"Communications uplink", "uplink port", "uplink" means a digital communications port through which command messages are received and status messages are sent.

"Communications downlink", "downlink port", "downlink" means a digital communications port through which command messages are sent and status messages are received.

"Command message" is an electronic message sent from a first electronic circuit to a second electronic circuit to initiate an action or state change by said second circuit.

"Status message" is an electronic message sent by a second electronic circuit to a first electronic circuit, said message containing information pertaining to state or action status of said second circuit, or another circuit.

"Encapsulant" is a fluid that is electrically insulating, but is thermally conductive. Many encapsulants are known. Encapsulants are poured, injected or drawn into a cavity of a housing, filling voids between components contained therein. In the context of the present invention, the primary function of encapsulants is to thermally couple the encapsulated components to each other and to the housing walls. Some encapsulants are formulated to chemically cure to a solid state after introduction into a housing cavity. Such encapsulants serve a secondary function of providing mechanical support to the encapsulated components. Other encapsulants, such as transformer oils, are formulated to remain in a liquid state. Their secondary function is to prevent the entry of moisture and contaminants into the encapsulated cavity.

The representative embodiment illustrated as an exploded view in FIG. 1 is a battery module comprising 192 cylindrical cells, arranged in two groups of 96 series connected cells, each individual group having a net nominal voltage of 400V. The illustrated embodiment is not numerically limiting, any number of series connected cell groups may be utilized, with any number of cells in each group, provided that the number of cells in each group is at least two. Cells may be of cylindrical, prismatic, pouch, or any other type.

The illustrated embodiment of module 10 plurality of cells 400, supported by mechanical alignment structures (MAS) 160 which also retain resistors 420. The MAS 160, cells 400 and resistors 420 are coupled to the primary PCBA 115, and also secondary PCBA 117. The assembled elements are housed in a first cavity of primary housing 100. An external interface PCBA 925 is housed in a second cavity of housing 100, and is electrically and communicatively coupled to PCBA 115 and PCBA 117.

In some embodiments, the first cavity of housing 100 containing the cells 400 will be filled with encapsulant (not shown) that may be thermally conductive, and may be formulated to cure to a solid state.

Thermally conductive endplates 150 are assembled to housing 100, and are thermally coupled to cells 400 by means of encapsulant, while being electrically isolated from cells 400.

In some embodiments, the second cavity of housing 100 containing the external interface PCBA 925 will be filled with encapsulant that may be thermally conductive, and may be formulated to cure to remain in a liquid state to facilitate servicing or replacement of the PCBA 925 while thermally coupling the encapsulated components to the housing, and preventing entry of moisture and contaminants. Seals of any known type may be employed as appropriate to prevent loss of liquid encapsulant.

Figure 2:
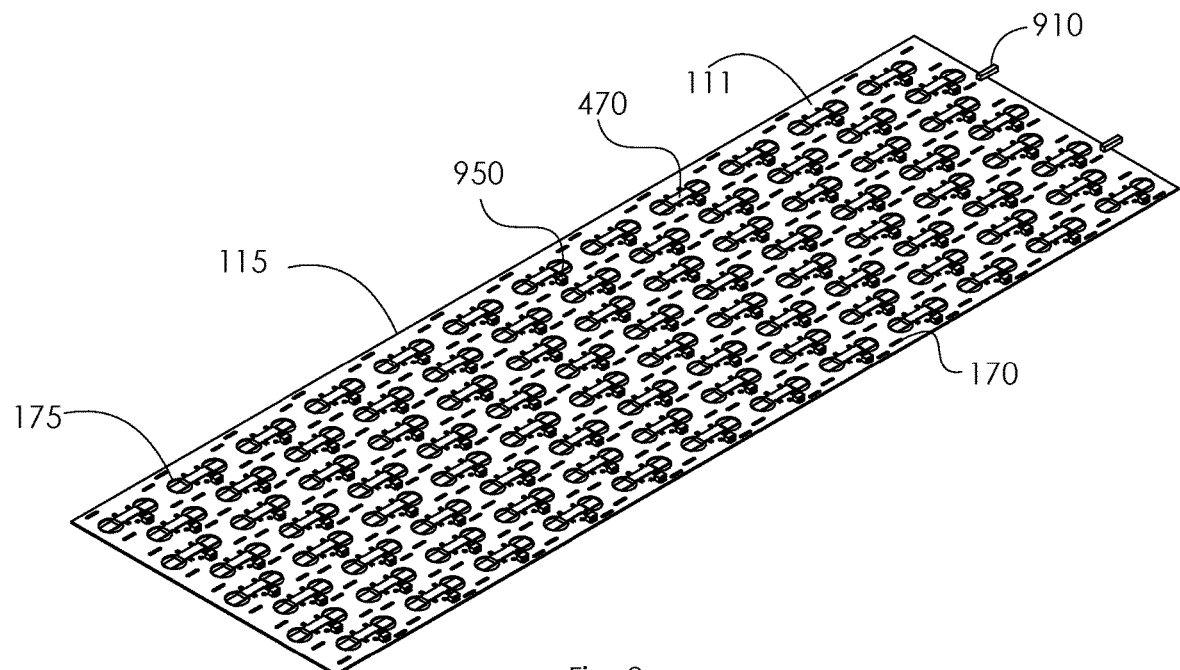
FIG. 2 illustrates a representative first PCBA of the present invention comprising a plurality of cell interconnects and a plurality of cell monitoring and conditioning circuits.

A representative non-limiting embodiment of primary PCBA 115 is illustrated in FIG. 2. It comprises a printed circuit board (PCB) 111, a plurality of cell interconnects 470, a plurality of cell monitoring and conditioning circuits 950, and one communications connector 910 for each associated group of series connected cells that is to be coupled to the PCBA. The PCB 111 comprises a non-conductive substrate on which electrical circuits are etched. Such PCBs and circuits are well known, as are means of assembling electrical circuit elements to PCBs, and therefore the details of their construction are not described or illustrated herein for brevity.

Apertures 175 are illustrated which allow the coupling of cell interconnects 470 to cells 400 during module manufacture and are not limiting. Such coupling is most commonly accomplished by welding, though other coupling methods may be used. The apertures 175 in the illustrated embodiment only serve the purpose of access for welding, and may not be present in embodiments that utilize assembly techniques which do not require such access. When apertures 175 are present, they may be of any appropriate shape and size for the intended function.

Apertures 170 are illustrated for mechanical coupling of mechanical alignment structures (MAS) to the PCBA 115 and are not limiting. The illustrated apertures are in the form of oval shaped slots, however any shape and type of mechanical coupling interface are possible.

Figure 3:
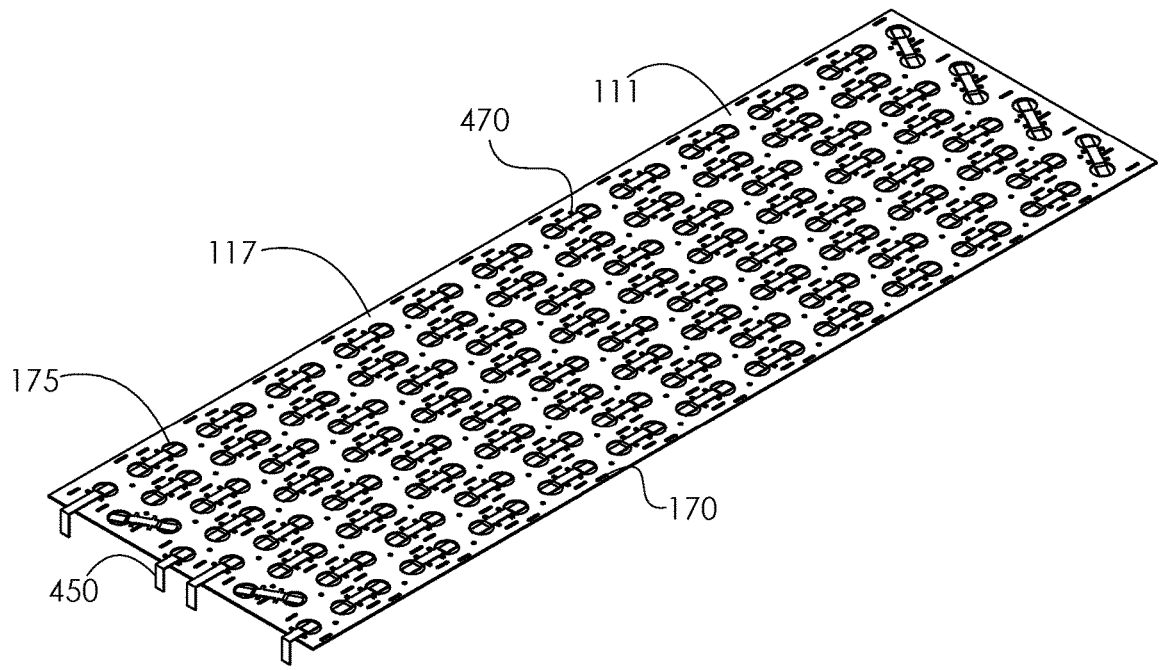
FIG. 3 illustrates a representative second PCBA of the present invention.

An optional secondary PCBA 117 is illustrated in FIG. 3. Its primary purpose in the illustrated embodiment is to retain and align a plurality of cell interconnects 470, provide electrical connections between cell interconnects and resistors 420, and provide electrical connectors 450 to connect the groups of cells 400 to external interface PCBA 925. In some embodiments the cell interconnect and electrical connectors may be coupled directly to the cells, without the need of a dedicated PCBA. In such embodiments the secondary PCBA 117 may be omitted.

Figure 4:
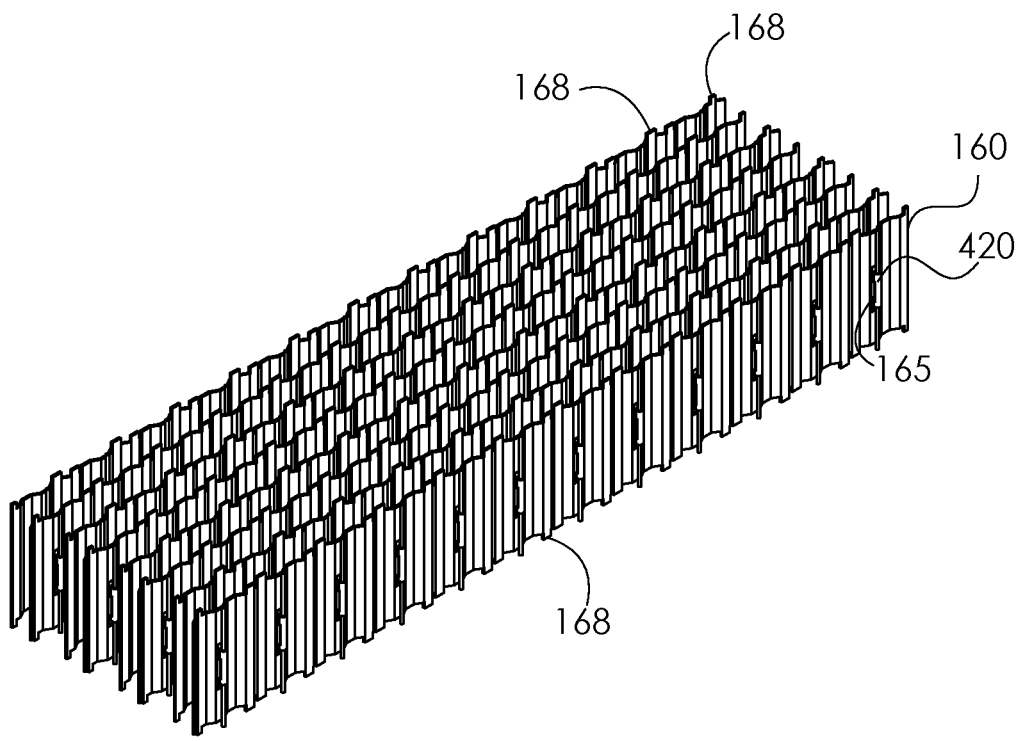
FIG. 4 shows a plurality of mechanical alignment structures having resistor retaining means and a plurality of resistors retained therein.

FIG. 4 illustrates one embodiment of a plurality of mechanical alignment structures (MAS) 160 that may be fabricated from stamped aluminum. The purpose of MSA 160 within embodiments of the present invention is to mechanically align and couple the various elements of the module 10 with respect to each other during assembly, and in use. The illustrated embodiment is not limiting in shape, material, or specific function. A plurality of cylindrical resistors 420 are shown being retained by retaining means 165. Other embodiments utilizing resistors of different shapes, including those assembled directly to cells, are possible. In such embodiments the retaining means 165 may be different or omitted entirely.

Mechanical retention tabs 168 are illustrated which interface with alignment slots 170 of the illustrated PCBA 115 and 117. The illustrated features are only representative and not limiting.

Figure 5:
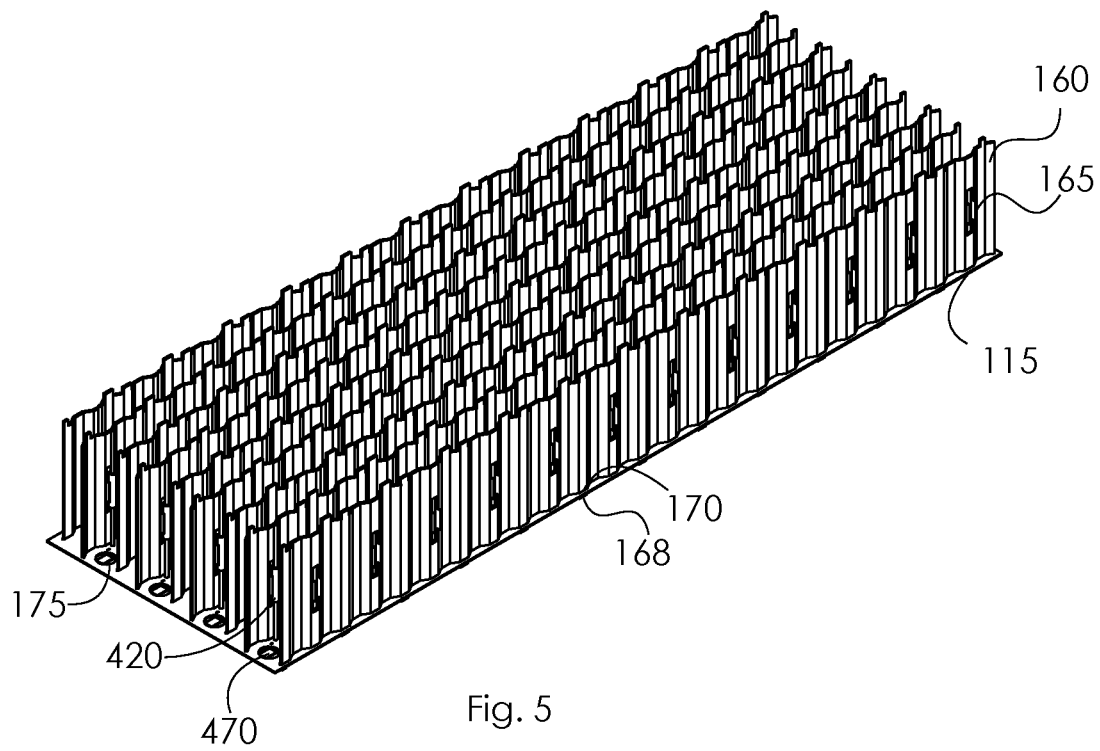
FIG. 5 shows mechanical alignment structures and retained resistors assembled to a PCBA.

FIG. 5 shows the plurality of MSA 160 and resistors 420 mechanically coupled to PCBA 115.

Figure 6:
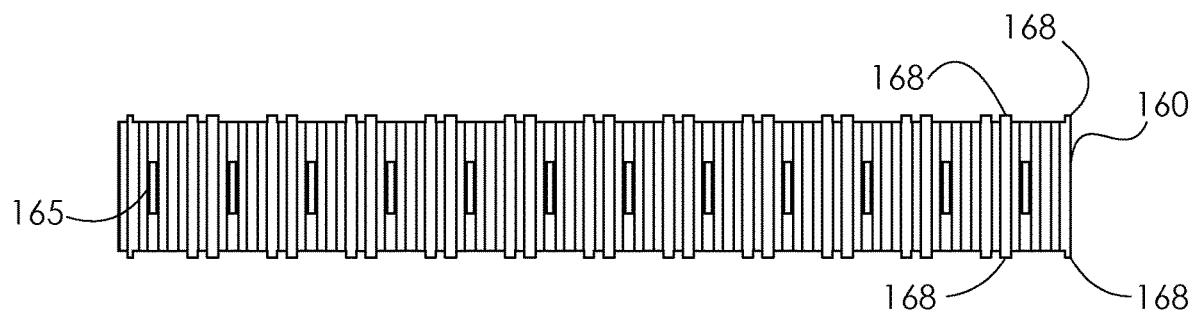
FIG. 6 is a side view of a representative mechanical alignment structure fabricated from stamped aluminum.

The representative MSA 160 is further illustrated in FIG. 6.

Figure 7:
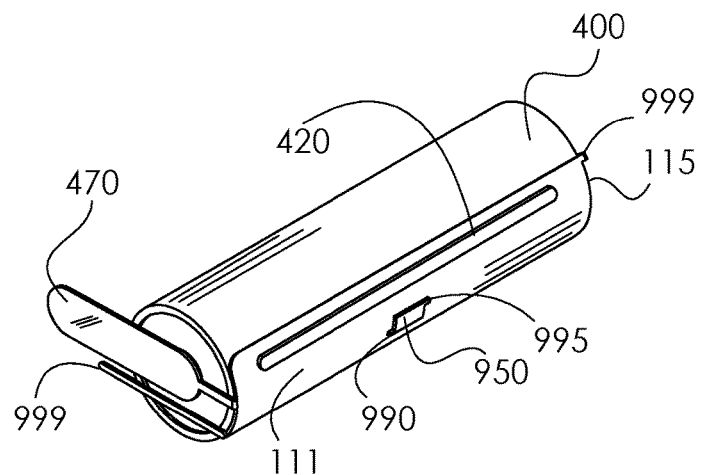
FIG. 7 shows a PCBA configured as a flexible circuit coupled to a single cylindrical cell.

An embodiment having a flexible PCBA 115 mounted directly to cell 400 and suitable for series connections to other similarly configured assemblies is shown in FIG. 7. Interconnect 470 and communications links 999 are shown as integral parts of the flexible substrate 111. Resistor 420 and battery cell monitoring and conditioning circuit 950 are shown as separate elements, however in some embodiments the resistor 420 may be incorporated within circuit 950, and may be a transistor or array of transistors. Circuit 950 is shown having an uplink port 990 and a downlink port 995. Connections between a circuit and interconnects within a flexible substrate are well known in the art of PCBA construction and are not explicitly shown.

Figure 8:
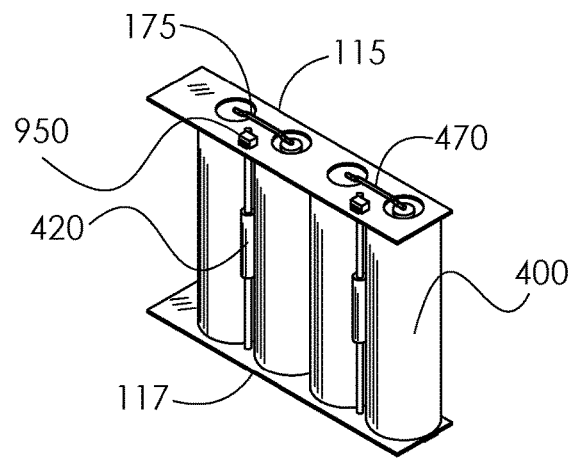
FIG. 8 illustrates cylindrical cells electrically connected in series and to PCBA by interconnects fabricated from metal wire.

FIG. 8 is a partial illustration of another embodiment of the present invention, wherein cells 400 are coupled to PCBA 115 and 117 by means of connectors 470 formed from wire, with resistors 420 being soldered to PCBA 115 and 117, and wherein no MSA is present.

Figure 9:
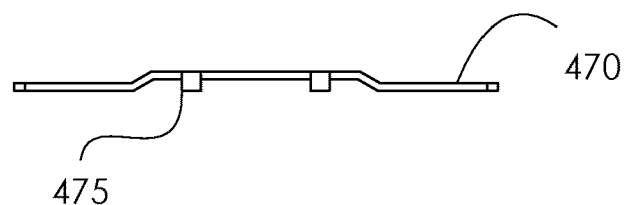
FIG. 9 is a side view of a representative cell interconnect fabricated from stamped copper.
Figure 10:
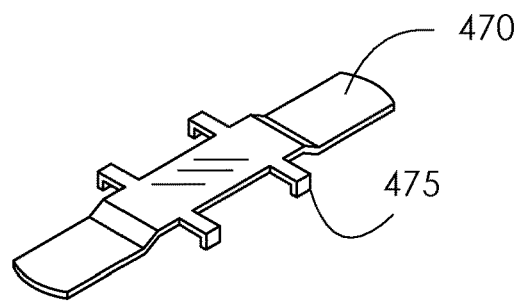
FIG. 10 is an isometric view of a representative cell interconnect fabricated from stamped copper.

FIG. 9 and FIG. 10 illustrate a representative embodiment of cell interconnect 470 that is formed from copper sheet, and comprises coupling features 475 for mechanically and electrically coupling the interconnect to a PCBA. Many types and shapes of cell interconnects, and the means of coupling them to cells and PCBA, are possible within the scope of the present invention and will be readily apparent to those skilled in the art.

Figure 11:
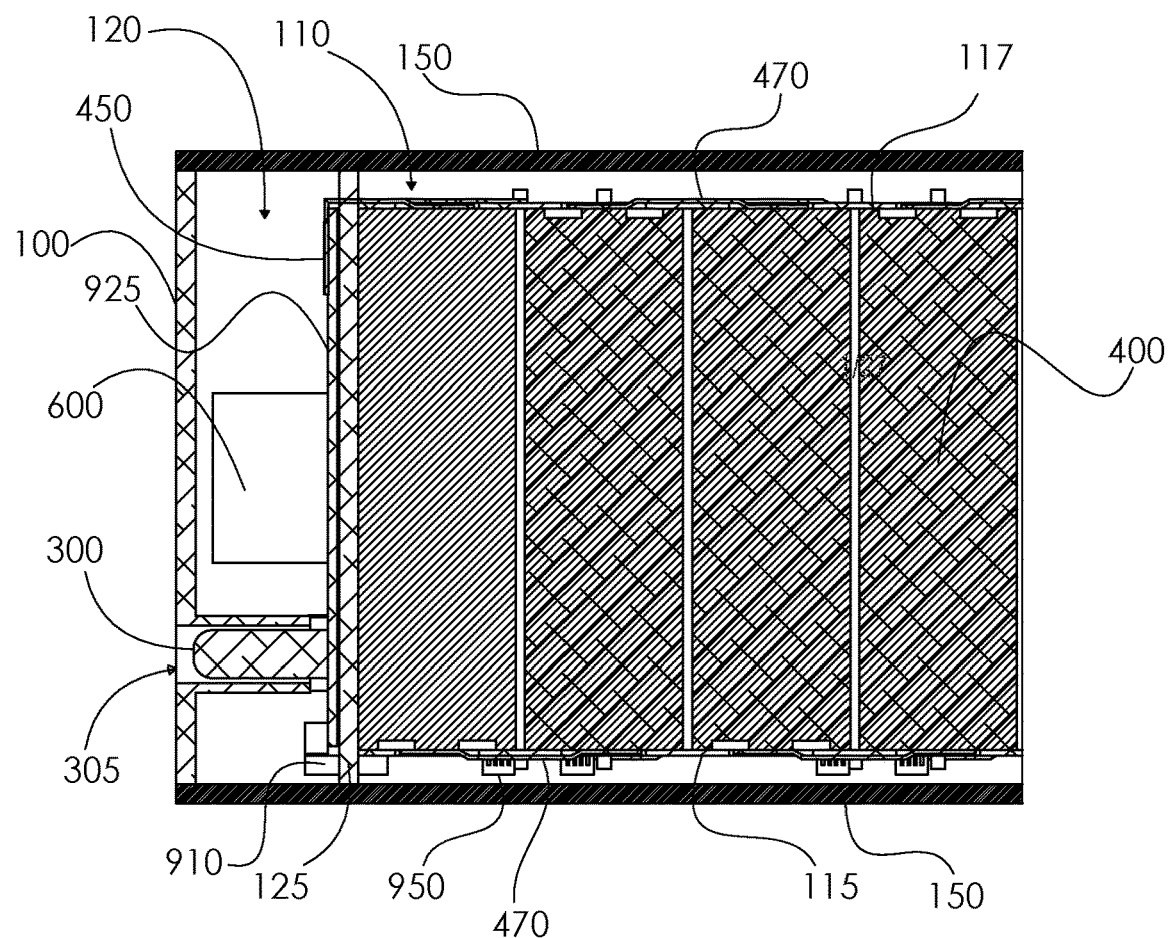
FIG. 11 is a partial cross-sectional view of an assembled module of the present invention.

FIG. 11 is a partial sectional view of an assembled module 10 that includes the thermally conductive endplates 150. A plurality of cells 400 are shown housed in a first cavity 110 of housing 100. The cells are electrically and mechanically coupled to PCBAs 115 and 117 by cell interconnects 470. External Interface PCBA 925 is shown contained in a second cavity 120 of housing 100, electrically coupled to PCBA 117 by connectors 450 and communicatively coupled to PCBA 115 by connectors 910. PCBA 115 is shown further comprising battery cell monitoring and conditioning circuits 950.

Figure 12:
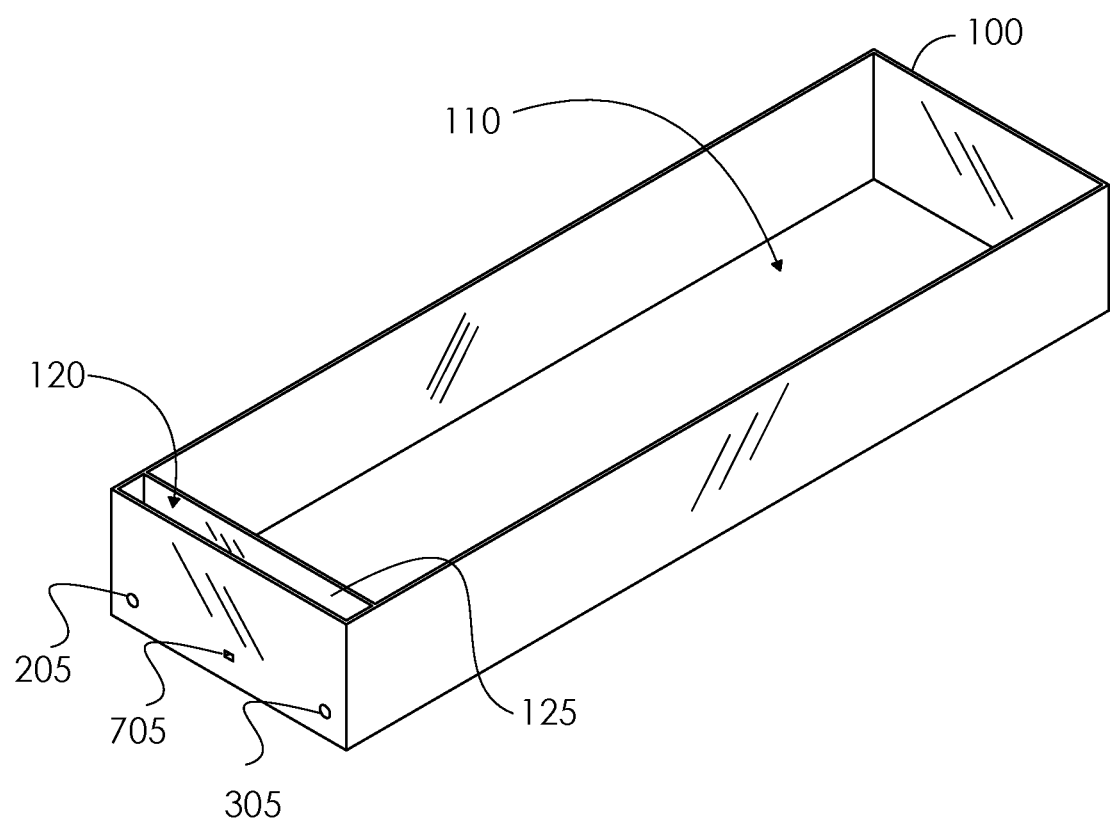
FIG. 12 illustrates a representative enclosure having a first cavity and a second cavity.

Partition wall 125 of housing 100, further illustrated in FIG. 12, separates cavities 110 and 120 in the illustrated embodiment, for the purpose of encapsulating cavity 110 with a first type of encapsulant, and in some embodiments encapsulating cavity 120 with a second type of encapsulant. Partition wall 125 is illustrative and not limiting. When partition wall 125 is present, apertures may exist in the wall for passing of connectors 450 and 910, as appropriate to the specific embodiment. In some embodiments the partition wall 125 may be formed as the surface of a volume of encapsulant that is poured to partially fill an enclosure and subsequently cured to a solid state. In other embodiments, a portion or the entirety of one or more exterior walls of the enclosure 100 may be formed as a surface of a volume of encapsulant that has been cured to a solid state.

Also illustrated in FIG. 11 is a negative terminal 300, being accessible via negative terminal aperture 305 of housing 100. The cross sectional view does not show positive terminal 200 or control bus connector 700. The illustration further shows a representative location of relay 600 assembled to PCBA 925.

A representative housing 100 is further illustrated in FIG. 12, showing a first cavity 110, a second cavity 120, a partition wall 125, a positive terminal aperture 205, a control bus connector aperture 705, and a negative terminal aperture 305. The shapes, location and function of the illustrated apertures are not limiting. In some embodiments, all such functions may be combined into a single aperture. Other embodiments may place apertures on different faces of the enclosure, and may combine them with mechanical retention and other functions. Seals and safety features of any known type may be employed without departing from the scope of the invention.

Figure 13:
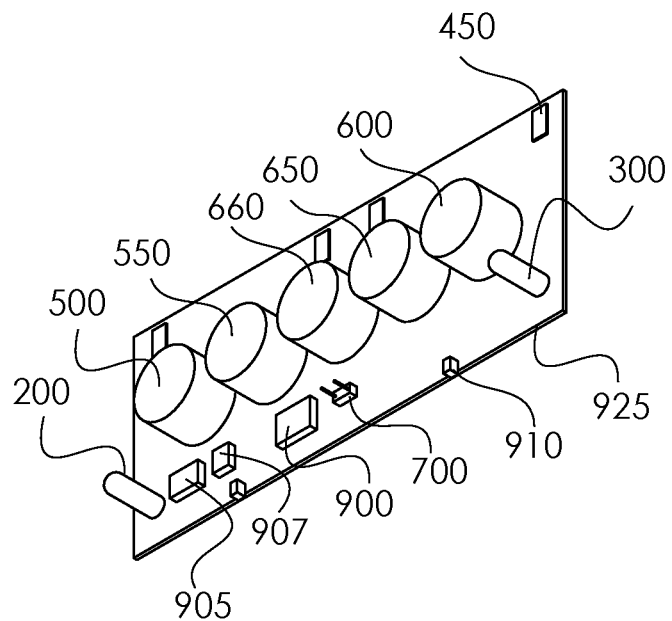
FIG. 13 shows a representative external interface PCBA configured to connect two independent groups of series-connected cells individually in parallel or together in series.

One embodiment of an external interface PCBA 925 is shown in FIG. 13, comprising positive terminal 200, negative terminal 300, battery management system (BMS) circuit 900, control bus connector 700, connectors 450 for electrically coupling to groups of series connected cells 400, and communication connectors 910 (see also FIG. 11) for communicatively coupling to PCBA 115 and the cell monitoring and conditioning circuits 950 (see also FIG. 11) comprised therein. A current sensor 905 is illustrated as being coupled to the positive terminal 200, other embodiments may couple a current sensor to negative terminal 300. A voltage measurement circuit 907 is shown connected to terminals 200 and 300. In some embodiments, voltage measurement circuit 907 may be internal to BMS circuit 900. Relays 500, 550, 600, 650 and 660 are also shown. The relays 500, 550, 600, 650 and 660 function in conjunction with PCBA 115 and two groups of series connected cells 400 is further diagrammatically illustrated in FIG. 17.

In some embodiments, relays 500 and 550 may be of a first type, and relays 600 and 650 may be of a second type. For example if the first type of relay is electromechanical it provides complete galvanic isolation when open. However, electromechanical relays are relatively slow to respond. If the second type of relay is solid state, which respond to control input very quickly, they can be used to open the circuit if current sensor 905 detects excessive current. Some solid state relays may not provide complete galvanic isolation. By utilizing two distinct types of relays, a PCBA 925 can provide both full galvanic isolation and fast response to excessive current conditions.

In some embodiments, the current sensor 905 may be of Hall Effect type.

Figure 14:
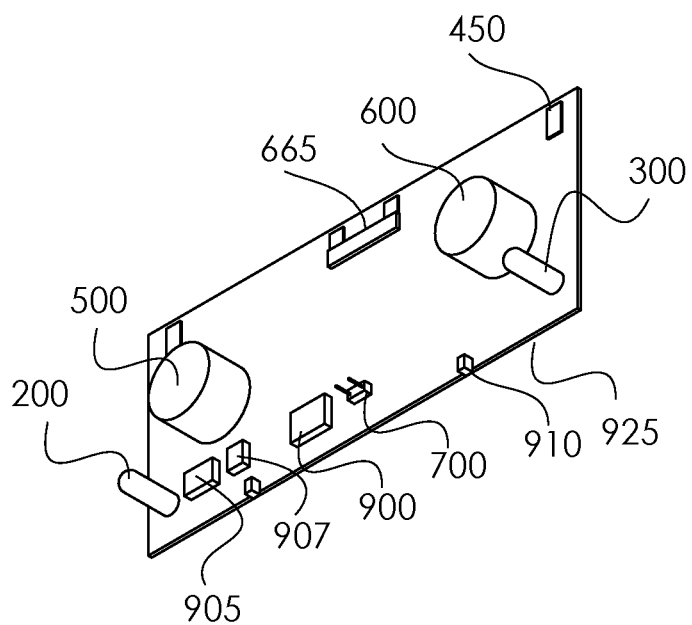
FIG. 14 shows a representative external interface PCBA configured to connect two independent groups of series-connected cells individually together in series.

Another embodiment of PCBA 925 is shown in FIG. 14 wherein relays 550, 650 and 660 are omitted, and relay 660 is instead replaced by interconnect 665 to connect two groups of series connected cells 400 in series with each other, thereby forming a single group of series connected cells.

In some embodiments, interchangeable configurations of PCBA 925 may be provided to configure the groups of series connected cells within a module by connecting them in parallel or in series, as desired. This interchangeability allows a module to be configured for operation at different voltages, for example 400V and 800V, after the module has been assembled, and the cavity 110 containing the cells 400 has been encapsulated with an encapsulant formulated to cure to a solid state.

In some embodiments, the functionality of PCBA 925 may be physically combined with functionality of PCBA 115 in a single assembly, without departing from the scope of the present invention.

In other embodiments, PCBA 115 may be comprised of a plurality of substantially identical assemblies electrically and communicatively coupled in series.

Figure 15:
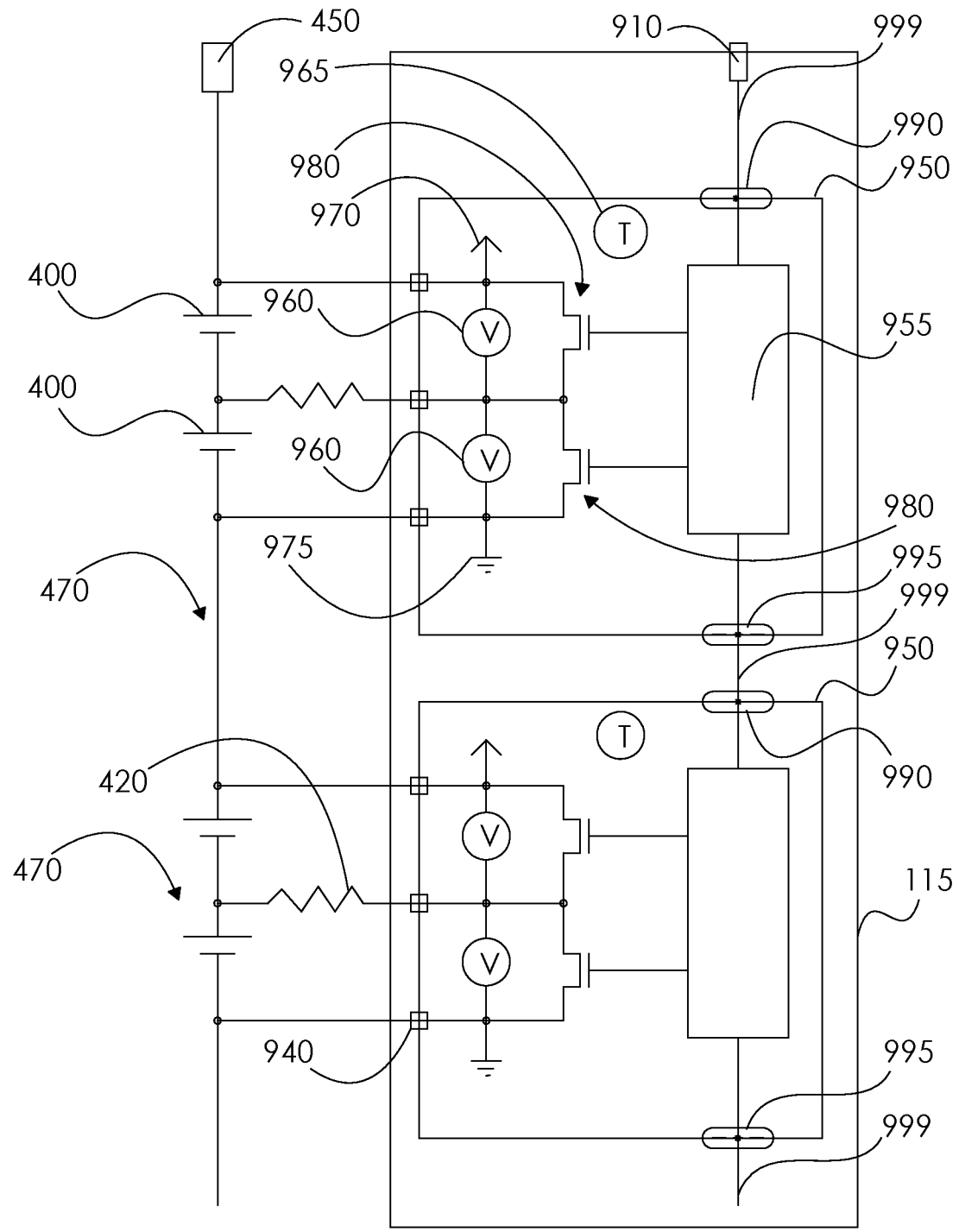
FIG. 15 is a diagram showing cell monitoring and conditioning circuits connected to a series of connected cells and resistors.

FIG. 15 is a diagrammatic illustration of the PCBA 115 with cell monitoring and conditioning circuits 950 of the present invention, and their connections to other elements of a module of the present invention. Elements shown in FIG. 15 without reference numerals are the same as like elements identified by reference numerals.

The illustrated configuration connects one circuit 950 to two among a group of series connected cells 400 by means of interconnects 940, which may be PCB traces. The cells are electrically connected in series within the module by interconnects 470. A single resistor 420 is shared between the two corresponding cells 400, and is alternatingly connected in parallel with one and then the other of the two cells by resistor switches 980, under the control of controller 955.

The illustrated circuit 950 further comprises a voltage measurement circuit 960 for each connected cell, a temperature measuring circuit 965, an uplink digital port 990 and a downlink digital port 995. The uplink port 990 of each circuit 950 is communicatively connected to the downlink port 995 of an adjacent circuit 950 by means of digital link 999 that is coupled to communication connector 910, with the exceptions that the uplink port of the first circuit 950 in the chain is communicatively connected to BMS circuit 900 on PCBA 925 by means of connector 910, and the downlink port of the last circuit 950 in the chain is not connected.

The positive power supply rail 970 of circuit 950 of the present invention is connected to the positive terminal of the most positive among the connected cells 400, and the negative power supply rail 975 of circuit 950 is connected to the negative terminal of the most negative among the connected cells 400.

A key distinguishing feature of the circuit 950 of the present invention is the separate and distinct uplink port 990 and downlink port 995. Ports for message communication are well known in the art. However the common approach is to connect such ports to a communications bus, such as CAN bus, I2C bus, or the like. In a battery module having a plurality of series connected cells, and a management circuit coupled to each cell, a very large voltage potential difference would exist between circuit connected to most positive cell, and one connected to most negative cell.

If the circuits are connected to a common message bus, the communications ports would have to be capable of accepting signals from other circuits at a very large voltage difference. While solutions for accommodating large voltage differences exist in the art, such as optical isolation, they significantly increase the cost and therefore run counter to the objectives of the present invention.

By specifying that uplink port 990 and downlink port 995 for each circuit 950 are distinct and separate, the communications links 999 are therefore implemented as point-to-point links rather than a bus. This requires that only the voltage differences between two adjacent circuits 950 be accommodated, which are small and can be readily implemented with inexpensive circuit components.

Some aspects of the illustrated configuration are advantageous but not limiting. Configurations of circuit 950 having connections only for a single cell and corresponding resistor, or more than two series connected cells and corresponding resistors, shall be readily apparent to those skilled in the art. The illustrated configuration provides the advantage of keeping the working voltages within each circuit low, reducing voltage potential between adjacent circuits, and simplifying PCB trace routing.

In particular, since uplink and downlink ports must be tolerant of input voltages above the local positive supply rail 970, and below the local negative supply rail 975, keeping the working voltages low allows the use of lower cost circuits to implement the links.

Figure 16:
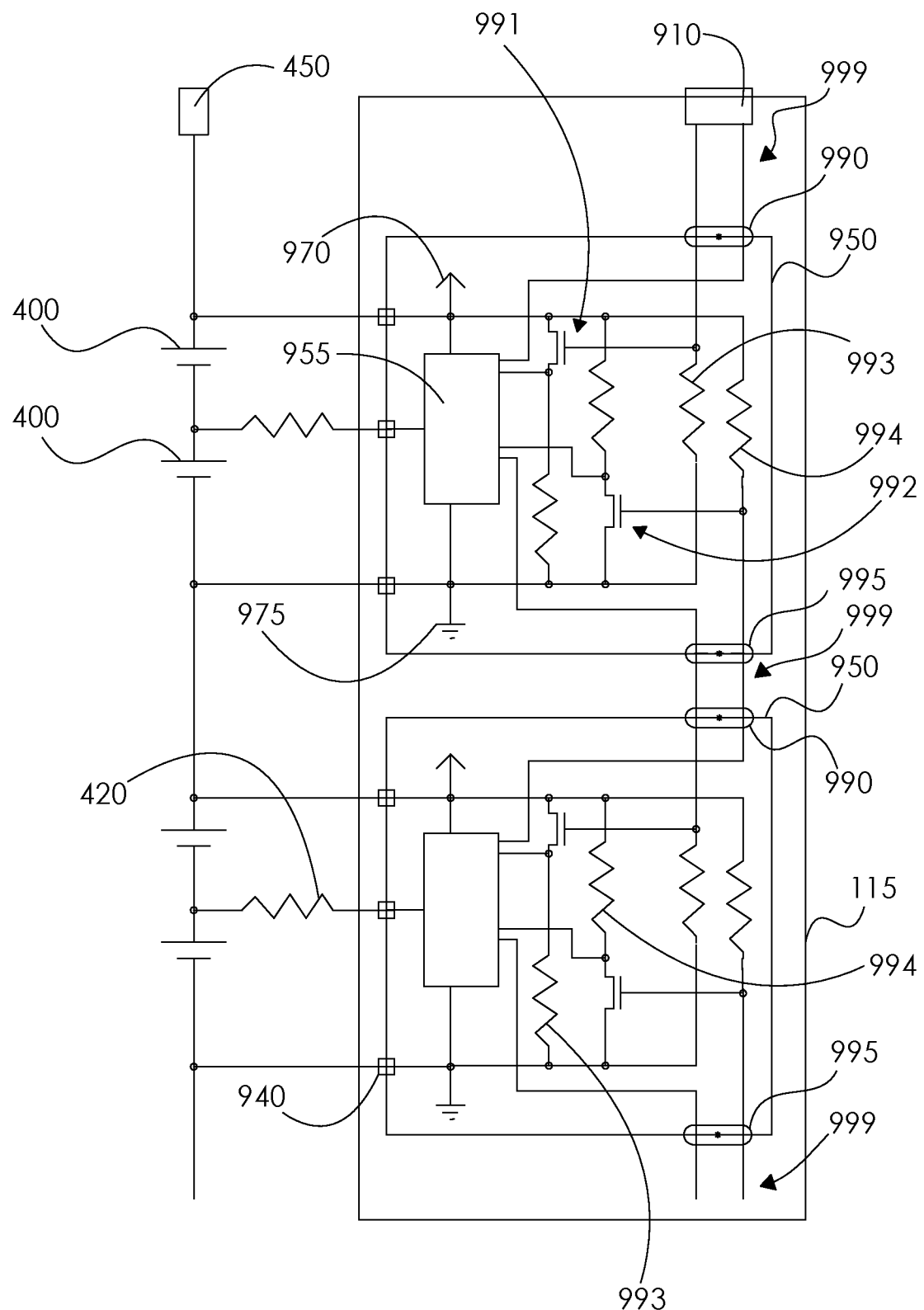
FIG. 16 illustrates a low-cost uplink and downlink circuit for communications between cell monitoring and conditioning circuits coupled to a series of connected cells.

FIG. 16 illustrates one embodiment of a low cost communications link 999 as a two-wire serial link. Like elements in FIG. 15 and FIG. 16 are not described hereinbelow for brevity. Signaling between adjacent circuits 950 is achieved by utilizing n-FET switch 991 with a pulldown resistor 993 on the uplink digital port 990 and a p-FET switch 992 with pullup resistor 994 on the downlink digital port 995. The illustrated embodiment allows for accommodating the voltage differences between adjacent circuits 950. The illustrated configuration allows the uplink digital ports 990 to accept signals which have a voltage that is above the voltage of positive power supply rail 970, and allows the downlink digital ports 995 to accept signals that may have a voltage that is below the voltage of the negative power supply rail 975. Many other embodiments are possible utilizing other circuit components with similar functionality.

The illustrated configuration further allows the circuit to be powered and continue to function in the event one of the connected cells develops an internal short and consequently presents reduced or zero voltage across its terminals.

These advantages serve the primary objective of enabling the manufacture of a reliable and safe module using readily available low cost mass production methods and materials.

Figure 17:
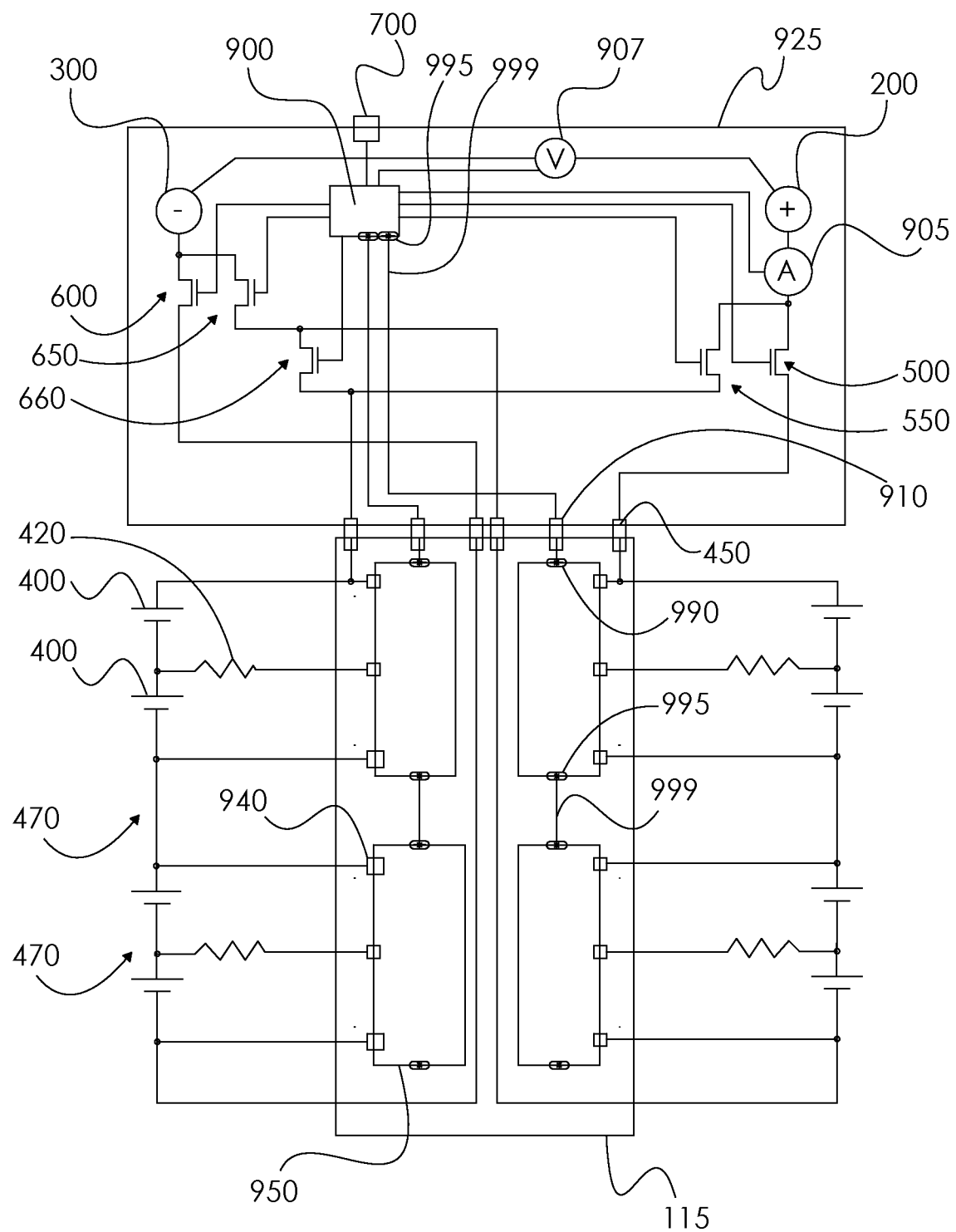
FIG. 17 is a diagram showing connections between two groups of series connected cells, cell monitoring, and conditioning circuits, and external interface PCBA.

Another embodiment is illustrated in FIG. 17 showing a cell monitoring and conditioning circuit 950 configured to be coupled to a single cell. Like elements in FIG. 15, FIG. 16, and FIG. 17 are not described hereinbelow for brevity. In this embodiment, the resistor 420 is coupled to PCBA 115 together with circuit 950. The illustrated embodiment shows resistor 420 as a separate element for clarity, however in other embodiments resistor 420 may be incorporated internally in circuit 950 as a transistor or an array of transistors operated in linear region, which may also act as resistor switch.

A separate dedicated PCBA 115 comprising a circuit 950 and a resistor 420 is mechanically thermally and electrically coupled to each corresponding cell in a module 10. The cells are electrically connected in series within the module by interconnects 470, and individual PCBAs 115 are correspondingly communicatively connected in series by communications links 999. In such embodiments PCBA 115 may be constructed as a flexible circuit.

Circuit 950 is preferably implemented as an application specific integrated circuit (ASIC) for the purpose of cost reduction. Embodiments utilizing discrete commercially available components can readily be built and shall become apparent to those skilled in the art of electrical circuit design based on disclosures made herein.

Some of the unique and distinguishing characteristics of the circuit 950 of the present invention are the uplink port 990 and downlink port 995 for connecting adjacent identical circuits in a chain to accommodate any number of series connected cells, and facilitating the control of the entire chain of circuits 950 from a single BMS circuit 900. The unique methods for operating such circuits are further disclosed herein.

Another unique feature of the illustrated circuit 950 is the ability to share one resistor between two cells, reducing overall component count, complexity and cost. This functionality is not limited to the two-cell configuration and may be readily implemented in a circuit configured to connect to any even number of series connected cells.

Another unique characteristic of the present invention is the ability to heat the cells 400 by dissipating some of the electrical energy stored in the cell in the resistor 420 when maintaining cells at a temperature above ambient is desired.

A conceptual representation of full electrical functionality of the circuits disclosed herein is shown in FIG. 17. The illustration is of a configuration having two groups of four series connected cells for clarity. It shall be readily apparent to one skilled in the art how configurations having any number of groups or any number of series connected cells may be constructed based on the disclosures made herein.

The diagram of FIG. 17 shows a PCBA 115 comprising four circuits 950, two for each of the two groups of 4 series connected cells. A single resistor 420 is shared between each pair of series connected cells that are coupled to a single circuit 950 by interconnects 940. Interconnects 940 may be printed circuit traces, wires, integrated circuit package pins, or any combination thereof. Cells are connected in series by cell interconnects 470. Electrical connectors 450 and communication connectors 910 between PCBA 115 and PCBA 925 are diagrammatically represented.

In some embodiments, connectors 910 will feature galvanic isolation by means of optical, inductive or wireless coupling. PCBA 115 and PCBA 925 are illustrated as separate for clarity of function, however they may be combined into a single physical assembly in some embodiments. In other embodiments PCBA 115 may comprise a plurality of substantially identical assemblies.

The illustrated configuration of PCBA 925 facilitates the connection of the two groups of series connected cells in parallel with each other, or in series with each other, by means of relays under the control of the BMS circuit 900. For series configuration, relays 500, 600, and 660 are closed while relays 550 and 650 are open. To achieve parallel connection of the groups, relays 500, 550, 600 and 650 are closed while relay 660 is open. For safety when not in use, full isolation of terminals 200 and 300 is achieved by opening all the relays.

The illustrated BMS circuit 900 comprises two downlink ports 995, each being communicatively connected via communications link 999 and communications connector 910 to a chain of circuits 950, each chain corresponding to a group of series connected cells 400.

A control bus port 700 is provided for communication with an external controller such as pack controller, vehicle controller (VCU), charger and the like.

In some embodiments, terminals 200 and 300, and control bus port 700, may be combined into a single physical connector.

Additional low voltage power connector may be provided in some embodiments to power the BMS circuit 900 and relays 500, 550, 600, 650 and 660 independently of the cells 400.

Figure 18:
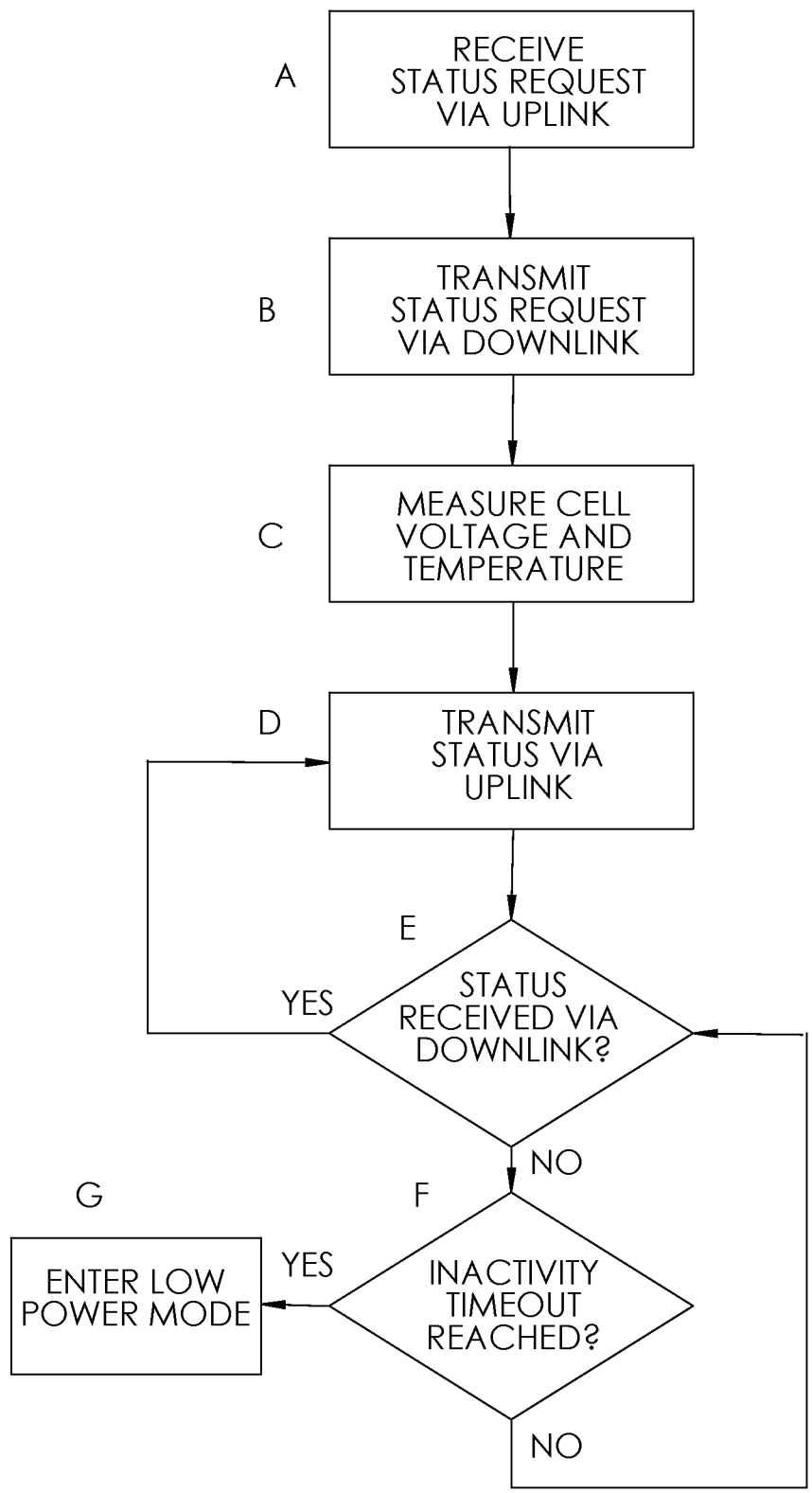
FIG. 18 is a flow diagram of a method for reporting cell status in a single-cell monitoring and conditioning circuit.
Figure 19:
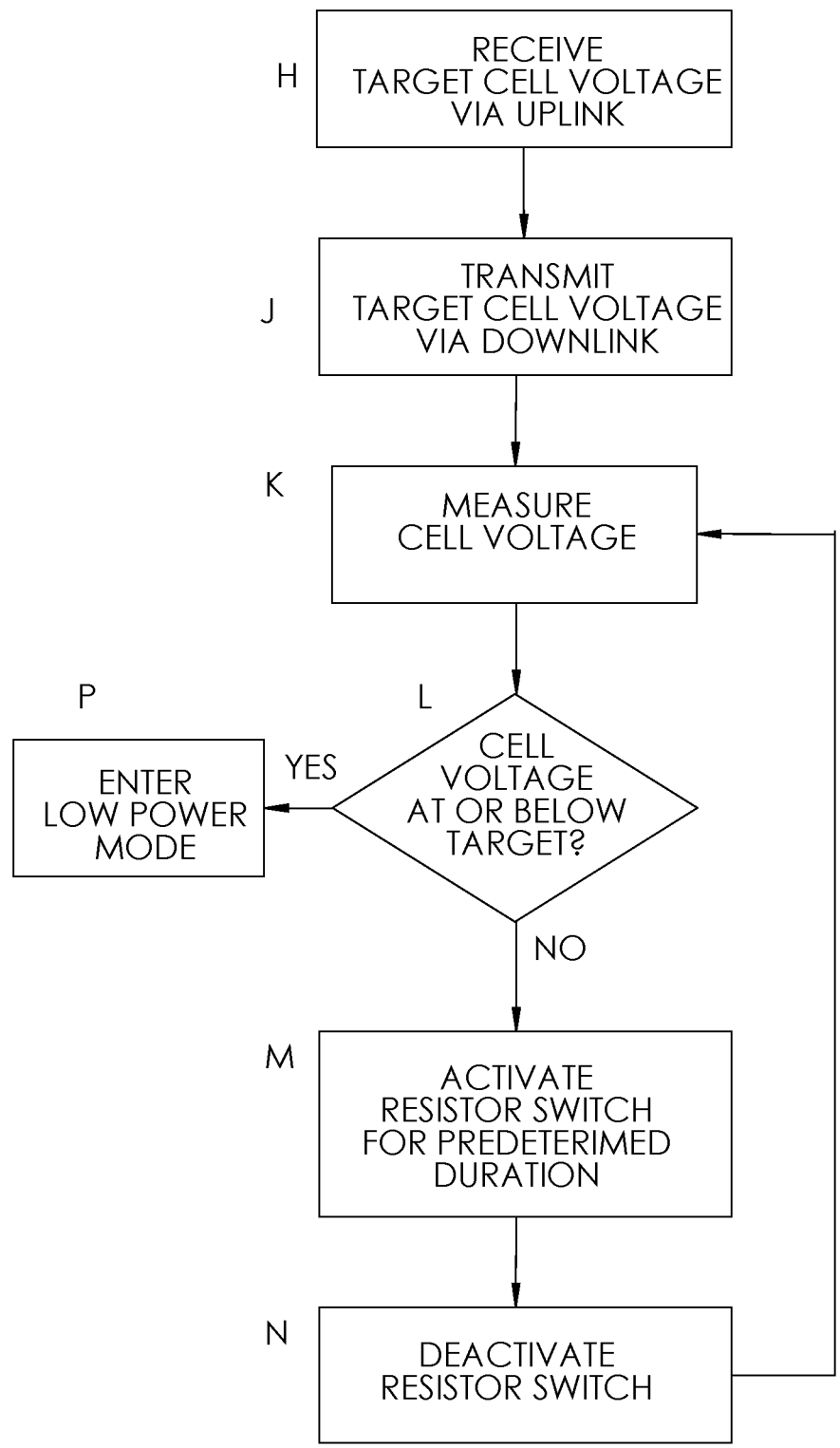
FIG. 19 is a flow diagram of a method for conditioning a cell by a single-cell monitoring and conditioning circuit.
Figure 20:
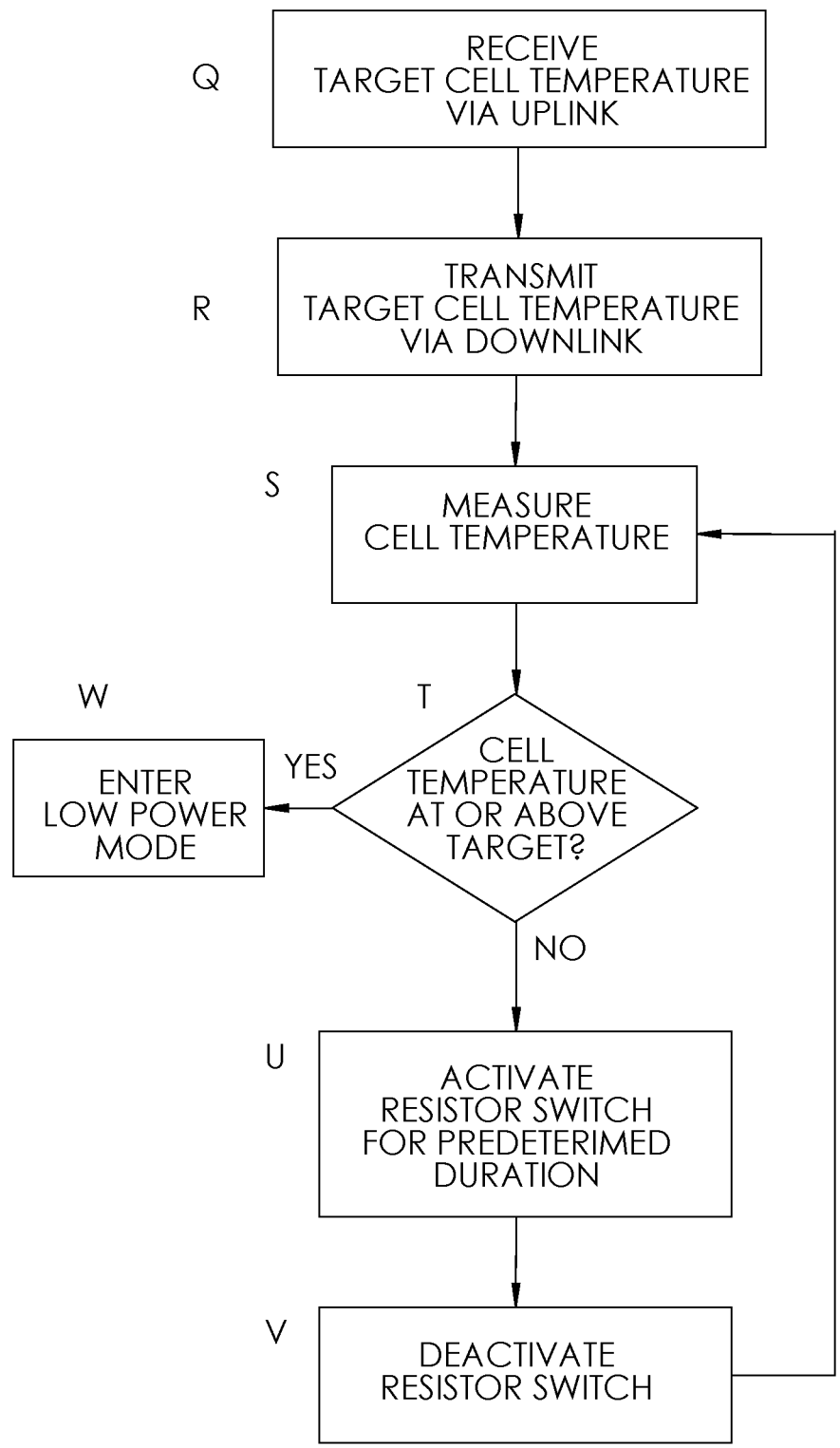
FIG. 20 is a flow diagram of a method for heating a cell by a single-cell monitoring and conditioning circuit.

Methods for operation of a circuit 950 of the present invention are conceptually represented in FIG. 18, FIG. 19 and FIG. 20. The methods are described with regard to a single cell coupled to a circuit 950. In configurations where more than one of a series connected cells are coupled to a single circuit 950, the method is repeated for each coupled cell. Such repetition shall be readily apparent to those skilled in the art and therefore the detailed description thereof is omitted for brevity.

To obtain the status, which may include cell voltages and temperatures, of the entire module, the BMS circuit 900 issues a status request command message via downlink 995 to a first circuit 950 coupled to circuit 900 by means of a communications link 999 and the communications connector 910.

As illustrated in FIG. 18, upon receipt of the status request command message via its uplink 990 in step A, each circuit 950 reissues same status request command message on its downlink 995 to the next circuit 950 in the series connected chain in step B.

The circuit 950 then measures the status of its coupled cell in step C, then transmits the results via its uplink in step D.

If more than one series connected cell is coupled to a circuit 950, steps C and D are repeated for each cell. This repetition is not explicitly illustrated in FIG. 18.

In steps E and F the circuit 950 then waits to receive status messages from subsequent circuits 950 in the chain. For each such message received, step D is repeated transmitting via uplink the status message received via downlink.

In some embodiments, a predetermined period of inactivity may be specified after which circuit 950 enters a low power mode. When in low power mode, a circuit 950 may be configured to wake on receipt of a message, such as at step A.

Once all the status request command messages are transmitted via downlinks to all circuits 950 in the chain, and resulting status messages are transmitted via uplinks back to circuit 900, the circuit 900 will have received the status of all the cells in the module.

To balance all the cells in the module, the BMS circuit 900 will first compare all cell voltages reported in response to status request command message, select a suitable target voltage, which may be the lowest among reported voltages, or another value arrived at by an algorithm.

Circuit 900 then issues a target cell voltage command message via downlink 995 to a first circuit 950 coupled to circuit 900 by means of a communications link 999 and the communications connector 910.

As illustrated in FIG. 19, upon receipt of the target cell voltage command message via its uplink 990 in step H, each circuit 950 reissues same target cell voltage command message on its downlink 995 to the next circuit 950 in the series connected chain in step J.

The circuit 950 then measures the voltage of its coupled cell in step K. If the measured cell voltage is above the commanded target cell voltage based on comparison made in step L, circuit 950 will connect the coupled resistor 420 in parallel with the coupled cell by means of resistor switch 980 for a predetermined amount of time in step M. Upon expiration of the predetermined amount of time the resistor is decoupled from the cell in step N. In some embodiments the resistor 420 and resistor switch 980 may be one in the same, implemented as a transistor or an array of transistors, operated in linear region. In some embodiments this resistance may be varied to produce a desired rate of energy dissipation in the resistor.

If more than one series connected cell is coupled to a circuit 950, steps K through N are repeated for each cell. This repetition is not explicitly illustrated in FIG. 19.

To maintain all the cells in the module at a predetermined temperature, the BMS circuit 900 issues a target cell temperature command message via downlink 995 to a first circuit 950 coupled to circuit 900 by means of a communications link 999 and the communications connector 910.

As illustrated in FIG. 20, upon receipt of the target cell temperature command message via its uplink 990 in step Q, each circuit 950 reissues same target cell temperature command message on its downlink 995 to the next circuit 950 in the series connected chain in step R.

The circuit 950 then measures the temperature of its coupled cell in step S. In some embodiments, the circuit 950 may be thermally coupled to a plurality of cells, or may be configured to measure the local temperature in proximity of one or more cells rather than that of any one cell directly. For the purposes of this description and the claims based thereon, all such measurements are considered cell temperature measurements.

If the measured cell or local temperature is below the commanded target cell temperature based on comparison made in step T, circuit 950 will connect the coupled resistor 420 in parallel with the coupled cell by means of resistor switch 980 for a predetermined amount of time in step U. Upon expiration of the predetermined amount of time the resistor is decoupled from the cell in step V. In some embodiments the resistor 420 and resistor switch 980 may be one in the same, implemented as a transistor or an array of transistors, operated in linear region. In some embodiments this resistance may be varied to produce a desired rate of energy dissipation in the resistor.

In some embodiments it may be desirable to minimize the number of distinct electrical connections within a module, in order to both reduce cost and increase reliability. FIG. 7 illustrates an assembly of a PCBA 115 being coupled to a single cell 400, having an integral interconnect 470 and distinct connections for communications links 999 corresponding to uplink port 990 and downlink port 995. In some embodiments it is desirable to eliminate the distinct communication link connections by injecting the communications signal onto the power conducting interconnects 470.

Techniques are known in the art of digital communications to inject a communications signal on a single power conductor using transverse mode wave propagation of a high frequency carrier signal. To carry information, the high frequency carrier signal is modulated by one or more of several known techniques, which include amplitude modulation, frequency modulation, phase shift keying, pulse position modulation and the like. Pulse position modulation is particularly well suited to the circuits of the present invention due to its low cost of implementation compared to the alternatives.

Injecting a communications signal on the power conductor would allow the interconnect 470 to carry the signal of links 999 between cells and eliminate the distinct connections illustrated in FIG. 7. However, such techniques require very high signal frequencies, at least above 20 Megahertz (MHz) and preferably in the hundreds or thousands of MHz. At such high frequencies, many cell types present a substantially high impedance to the signal. Therefore a group of series connected cells would not typically provide reliable conduction of a high frequency signal from the first cell in the group to the last.

The unique configuration of the circuit 950 of the present invention having a distinct and separate uplink and downlink solves this issue by only requiring the communication signal of a link 999 to traverse a single interconnect 470 between adjacent cells. This further allows very low signal power to be used, greatly reducing unintentional radiated electromagnetic energy and reducing overall energy loss.

Figure 21:
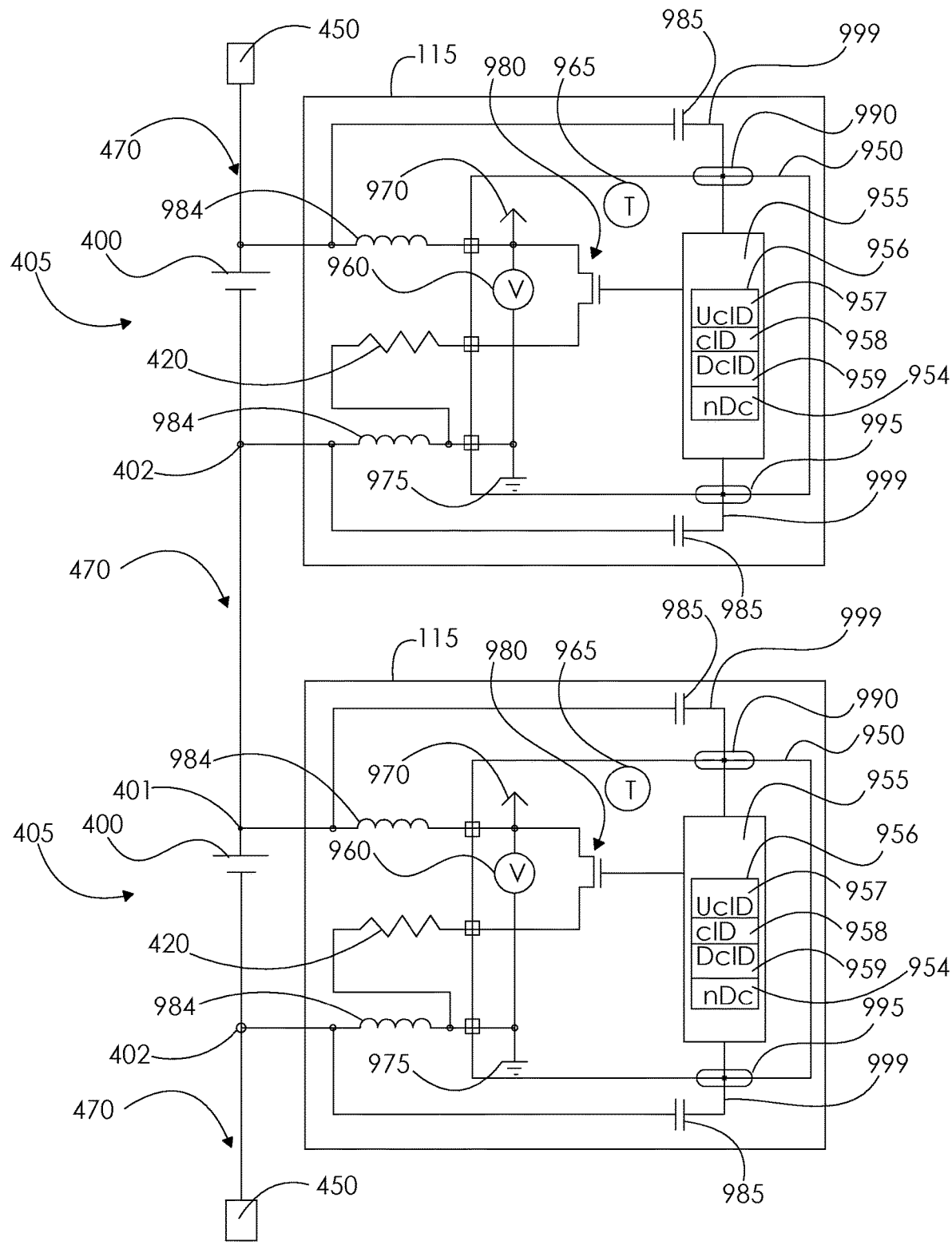
FIG. 21 illustrates cell monitoring and conditioning circuits with uplink and downlink ports being communicatively coupled to cell terminals.
Figure 22:
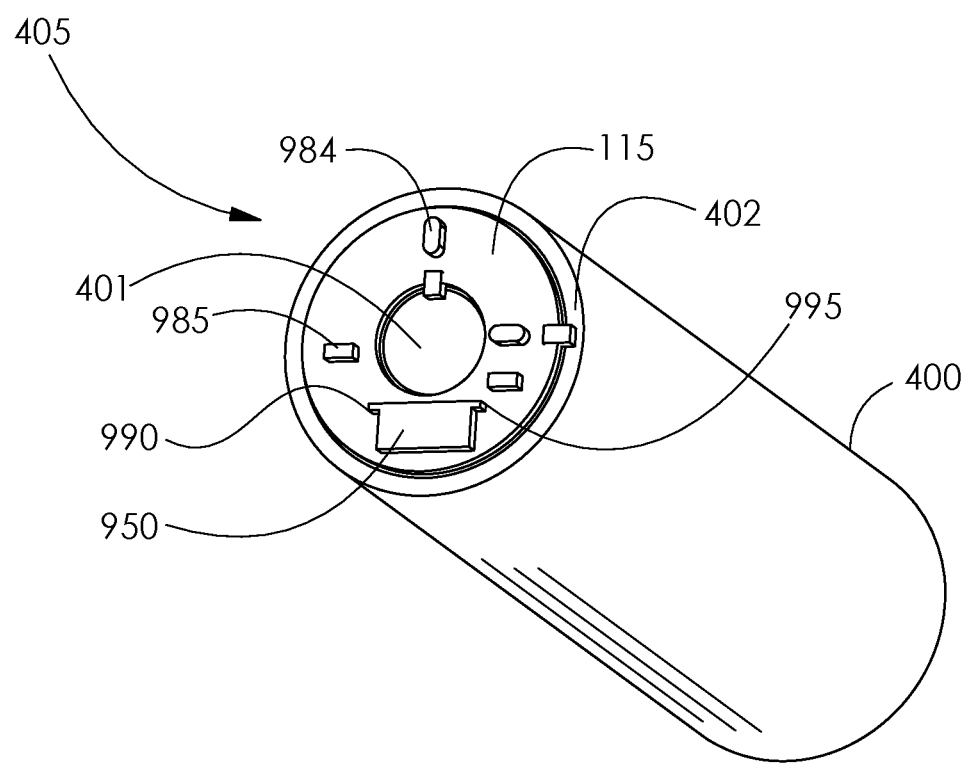
FIG. 22 shows a battery cell assembly with a battery cell and a PCBA comprising a monitoring and conditioning circuit.

Such a configuration is representatively illustrated in FIG. 21, showing a PCBA 115 being coupled to positive terminal 401 and negative terminal 402 of each cell 400, utilizing capacitors 985. Together, each PCBA 115 and the corresponding cell 400 may form a cell assembly 405 (FIG. 22). A plurality of cell assemblies 405 may be connected in series by means of interconnects 470. Within each assembly 405, the uplink and downlink ports are communicatively coupled to the positive and the negative terminals of the corresponding cell by alternating current (AC) coupling, thereby forming one half of each corresponding communications link 999.

Figure 24:
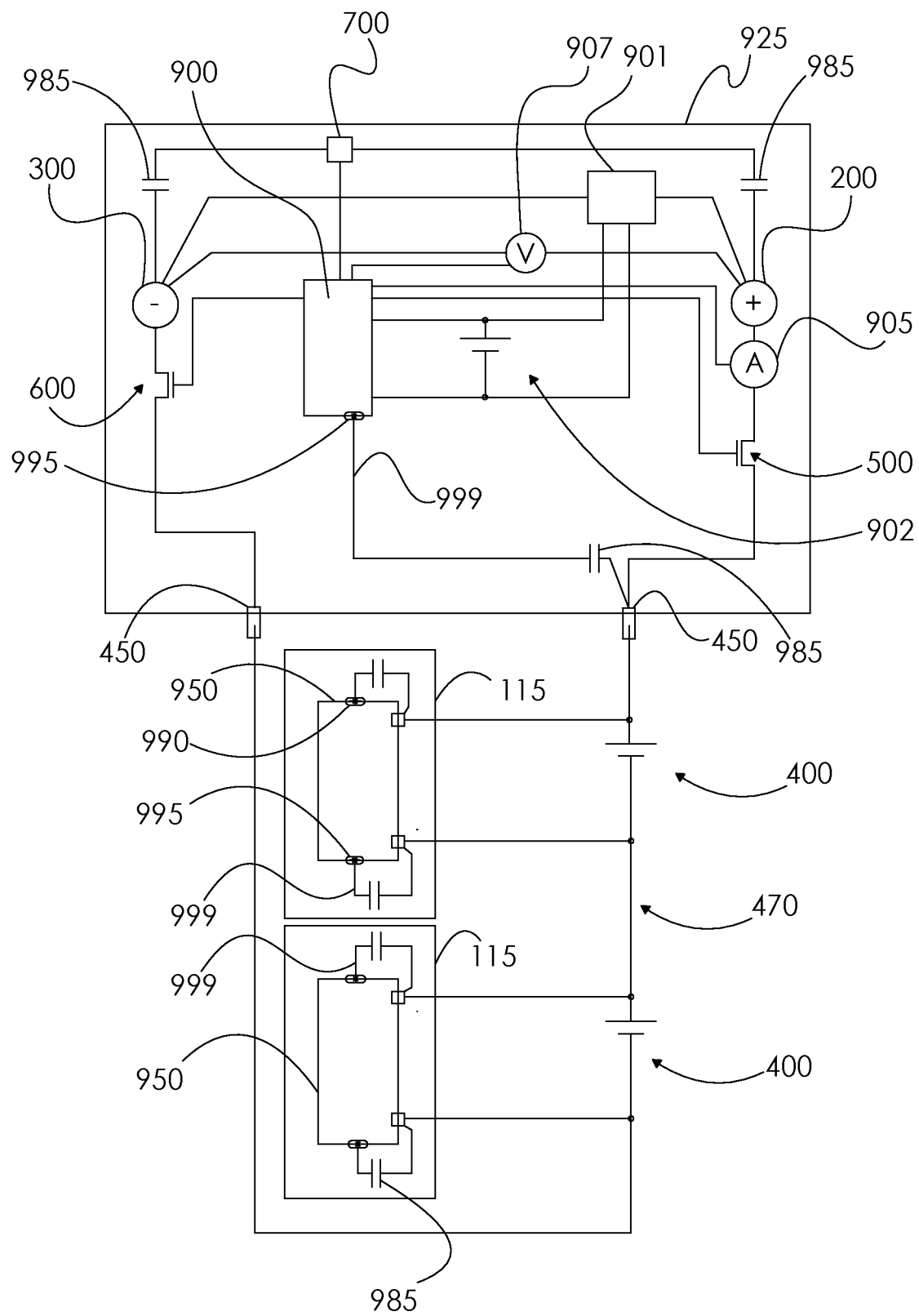
FIG. 24 is a diagram showing connections between a plurality of series connected cells, a corresponding plurality of cell monitoring and conditioning circuits having A.C. coupled communications links, and an external interface PCBA having a low voltage battery, a voltage converter, and A.C. coupled control bus port.

Upon making the series connection between two cell assemblies 405 by an interconnect 470, communicative coupling of the two corresponding circuits 950 is achieved by alternating current (AC) coupling of signal of the links 999 onto the corresponding interconnect 470, thereby communicatively connecting the two halves of the link formed within each assembly 405. The novel communicative coupling of a signal to a battery cell terminal within a battery cell assembly disclosed herein enables the forming of communications links between cell assemblies of the present invention by simply making a series electrical connection between the assemblies without the need for any additional wiring or connectors. A like communicative coupling of signals to the positive and negative terminals of a battery module is further disclosed herein (FIG. 24).

Only two assemblies 405 are illustrated in FIG. 21 for brevity. The illustration of FIG. 21 is not numerically limiting.

Many embodiments may utilize a greater number of series connected cells, which in some embodiments may be 192 cells resulting in an approximately 800V overall voltage. AC coupling is known in the art of communications circuits and in particular in the art of Power Line Communications (PLC), and is not described in detail here. Optional filtering inductors 984 are illustrated to keep the AC signal from reaching the positive power rail 970 and negative power rail 975 of circuit 950.

A resistor 420 is shown as being external to circuit 950. However, as previously disclosed herein, the resistor may be implemented internally to circuit 950 by operating the resistor switch 980 in the linear region.

FIG. 21 shows uplink 990 being coupled to the positive terminal 401 of cell 400, and the downlink 995 being coupled to the negative terminal 402 of the cell. This configuration is illustrative and not limiting. The opposite configuration is also possible without departing from the scope of the present invention, wherein uplink 990 is coupled to the negative terminal 402 of cell 400, and the downlink 995 is coupled to the positive terminal 401 of the cell.

Each circuit 950 is further illustrated as having a controller 955, each said controller having a nonvolatile memory 956 that is programmed with data 958 containing a circuit identifier (cID) that is unique among all circuits 950 comprised in a module 10 (FIG. 1). In the illustrated embodiment, each nonvolatile memory 956 is further programmed with the data 957 containing the unique cID of the circuit 950 that is coupled to the corresponding uplink port 990 (identified by an Uplink cID, or UcID), and the data 959 containing the unique cID of the circuit 950 that is coupled to the corresponding downlink port 995 (identified by a Downlink cID, or DcID). Such programming may be accomplished during the manufacture of battery module 10 by any known method. The nonvolatile memory 956 may be of one time programmable (OTP) type. A distinct cID may be assigned to the module controller 900 (FIG. 17) and contained in the UcID data that is programmed into the memory 956 of circuit 950 which is configured to have its uplink port 990 to be communicatively coupled to module controller 900 (FIG. 17). The circuit 950 which does not have another circuit coupled to its downlink port 995 may have a predetermined value programmed in its DcID data, which may be zero or another predetermined value to represent no connection (NULL).

FIG. 21 further illustrates data 954 (identified by number of Downstream circuits, or nDc) which is representative of the total number of cells connected in series to the downlink port 995 of the corresponding circuit 950. This data is optional and may be used in some methods to optimize the timing of communications. Some embodiments may omit data 954.

It should be noted that in the illustrated embodiment the use of cID, UcID and DcID is illustrative and is not limiting. The purpose of the illustrated identifiers is to uniquely identify each valid pairing of the series connected circuits 950 for the purpose of exchanging messages, and rejecting any unintentionally received messages that may be exchanged between other valid pairings of circuits. In some embodiments, each communications link 999 may be assigned a unique link circuit identifier (LcID), and this unique link circuit identifier may be programmed in the respective DcID and UcID data of the two controllers 955 being communicatively coupled by the link. In such embodiments messages sent via the link 999 would contain the unique link circuit identifier.

The unique configuration illustrated in FIG. 21 facilitates the construction of a cell assembly comprising the cell 400 and the PCBA 115 having the circuit 950. Such an assembly 405 is illustrated in FIG. 22 utilizing a cylindrical cell. The illustration is representative and not limiting. Embodiments utilizing prismatic, pouch, or any other type of cell shall become apparent to those skilled in the art without departing from the scope of the present invention. A plurality of such assemblies can be connected in series by means of interconnects 470 (FIG. 21), coupling the cell assemblies both electrically and communicatively by means of the same physical connections. This allows for the minimum wiring and assembly labor in configuring a battery module 10 utilizing such assemblies.

While each cell 400 presents a substantially high impedance to the high frequency communications signal of the links 999, a substantially high impedance may not completely block the signal. Therefore, in a non-limiting preferred embodiment, steps can betaken to prevent or mitigate communications interference between non-adjacent circuits 950.

In some embodiments, command messages may be transmitted using signals of a first frequency, and status messages may be transmitted using signals of a distinct second frequency, such frequencies being selected so that the corresponding signals do not interfere with each other. In other embodiments, all signals may utilize the same frequency.

One type of method of preventing interference is by utilizing Time Division Multiplexing (TDM). TDM techniques are well known in the art of digital communications and are not detailed herein except in the aspects that are unique to the configuration of the circuits of the present invention. In particular, TDM techniques require a synchronization pulse to be used as reference for the initiation of the timing of a frame of the multiplexing scheme. Since a single signal may not reliably reach all among series connected circuits 950, a conventional synchronization pulse may not be possible in many embodiments. A novel TDM method is disclosed herein utilizing the unique cID 958 of each circuit 950 to facilitate synchronization between the circuits.

The battery module 10 of the illustrated embodiment is configured at the time of manufacture to connect the plurality of cells 400, and correspondingly the circuits 950 coupled to each said cell, in series. Substantially at or prior to the time such connections are made, each circuit 950 is assigned a unique cID 958 and the nonvolatile memory 956 of its corresponding controller 955 is programmed with data containing the cID 958, as well as UcID 957 and DcID 959 with data containing the cID of the corresponding circuits 950 made adjacent by said connections and being communicatively coupled by the corresponding link 999. In some embodiments a unique identifier may be assigned to the link 999, and the corresponding data UcID and DcID may be programmed with the link identifier.

Figure 23:
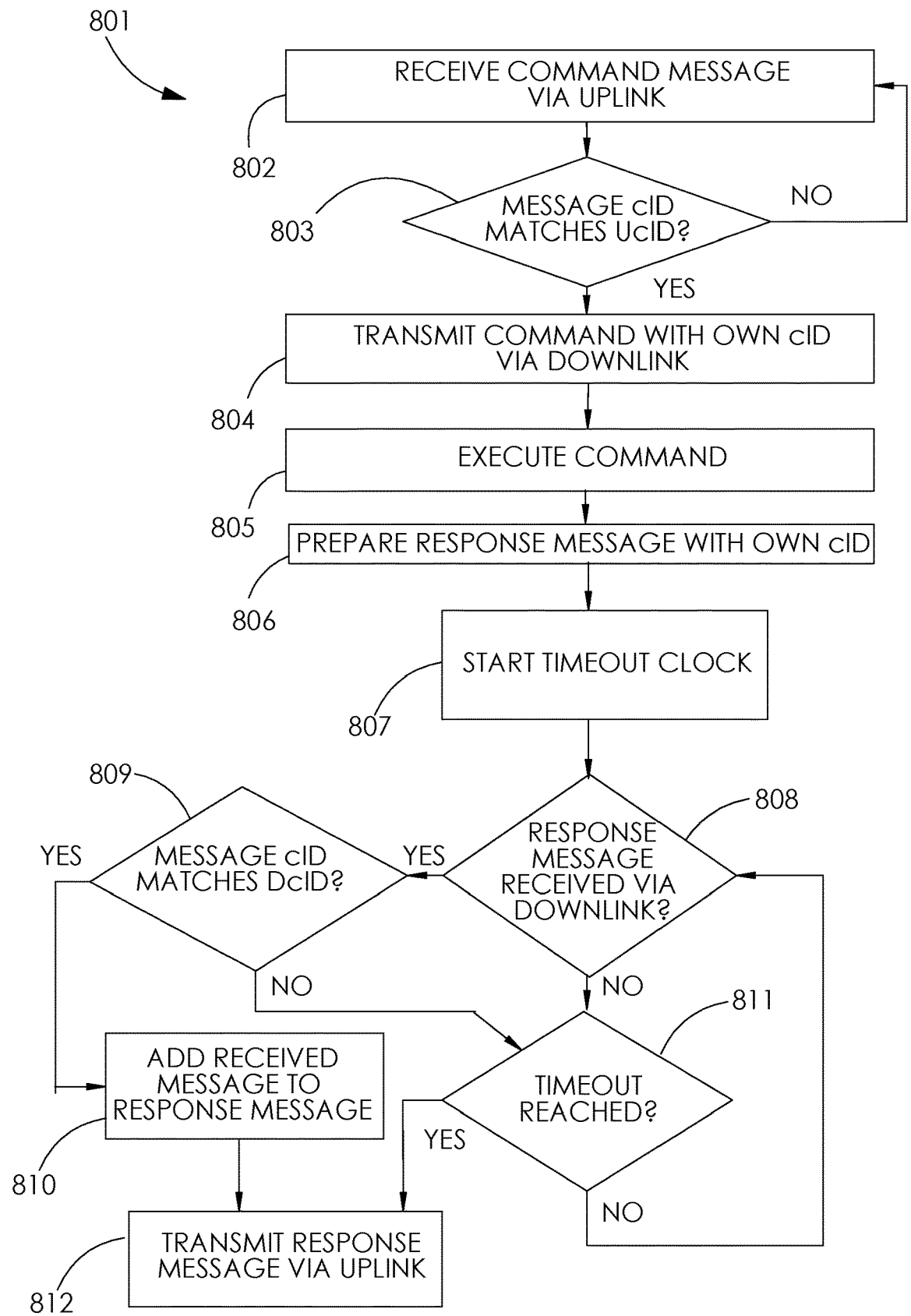
FIG. 23 is a flow diagram of a method for operating a battery cell monitoring and conditioning circuit with uplink and downlink ports being communicatively coupled to cell terminals.

A method of operating a circuit 950 to communicate with a plurality of other circuits 950 of the illustrated module 10 is shown in the flowchart of FIG. 23. The illustrated method implements TDM and further utilizes the unique cID 958 of circuits 950 of the present invention, and the data UcID 957 and DcID 959 that is programmed in nonvolatile memory 956 of each circuit 950.

The steps of the method are shown in the flow chart 801 in FIG. 23. It should be noted that in some alternative implementations, the functions noted in the blocks may occur out of the order noted in FIG. 23, may include additional functions, and/or may omit some functions. For example, two blocks shown in succession in FIG. 23 may in fact be executed substantially concurrently, the blocks may sometimes be executed in the reverse order, or some of the blocks may not be executed in all instances, depending upon the functionality involved, as will be further clarified hereinbelow. All such modifications and variations are intended to be included herein within the scope of this disclosure.

At block 802, a command message is received by controller 955 via the uplink port 990. The cID embedded in the message is compared to the UcID 957 value stored in nonvolatile memory 956 at block 803. If the values do not match (NO condition), the command message is ignored and the controller returns to block 802 until another message is received.

If the message cID matches UcID 957 (YES condition), the command is deemed valid and the controller proceeds to block 804. At block 804 the valid command message is retransmitted via the downlink port 995 with the circuit's own cID 958 as the sender ID embedded in the message. In some embodiments a unique link identifier may be used as the message cID.

At block 805 the command specified in the received command message is executed by the controller 955. Execution of the command may comprise measuring the voltage of the coupled cell 400, measuring the temperature, controlling the resistor switch 980, or the like.

A response message is prepared by the controller at block 806. The response message may include data for a measurement taken during the execution of the command at block 805, the status of the resistor switch 980, and the like.

In accordance with the method illustrated herein, the receipt and processing of a valid command message serves as the synchronization pulse for the TDM frame for the receiving controller 955. The timeout clock associated with the TDM frame is started at block 807. If the DcID 959 stored in nonvolatile memory 956 is NULL, indicating that no other circuits 950 are coupled to the downlink port 995, the timeout period is set to zero. In some implementations, optional data nDc 954 may be used to calculate an optimal timeout value. In other embodiments, the timeout value may be predetermined. The termination of the TDM frame for the controller 955 is triggered, as further described below, by either the receipt of a response message via the downlink port with sender cID matching DcID, or the expiration of the timeout period.

At block 808, the controller 955 checks if a message has been received via the downlink port. If a message has been received (YES condition), the cID embedded in the message is compared to the stored DcID 959 at block 809. If the values match, at block 810 (YES condition) the received message is appended to the response message prepared at block 806, and the resulting combined message is then transmitted at block 812 via the uplink port 990, using the cID 958 as the sender cID embedded in the message. In some embodiments a unique link identifier may be used as message cID. If the values at block 809 do not match (NO condition), the controller proceeds to block 811.

If at block 808 no message has been received (NO condition), at block 811 the timeout clock is checked for zero value. If timeout has not been reached and the timeout clock is nonzero (NO condition), the controller returns to block 808 to check for a new received message. If the timeout clock value is zero (YES condition), at block 812 the controller transmits the message prepared in block 806 with the cID 958 as the cID embedded in the message. The use of zero value of timeout clock herein is illustrative for the purpose of indicating that at least a predetermined amount of time has elapsed since the timeout clock was started at block 807, with the clock counting down to zero from a value set at block 807, and is not limiting. Any other value or any other timekeeping method may be used to indicate that at least the predetermined amount of time has elapsed, without departing from the scope of the present invention.

In some embodiments of the module of the present invention, it may be desirable to further couple the control bus port 700 to one or both of terminals 200 and 300 by means of AC coupling. This unique configuration would further reduce wiring and connection requirements, serving to reduce cost and improve reliability and security of the module. Such an embodiment is illustrated in FIG. 24.

In order to power the module controller 900, a voltage converter 901 is shown to convert high voltage power that may be present at the terminals into low voltage power suitable for use by controller 900. Such converters are known in the art of power supply design. A low voltage battery 902 is further illustrated to power the circuit 900 at times when high voltage power is not present at the terminals. Battery 902 may be of a rechargeable type.

The control bus port 700 is illustrated as being coupled to both terminals 200 and 300 by means of coupling capacitors 985. In some embodiments, longitudinal mode signal transmission may be employed, utilizing both terminals in the AC circuit. In other embodiments transverse mode signal transmission may be utilized, requiring only one of the terminals for the signal. In such embodiments the control bus port 700 may be coupled to only one of the terminals. In yet other embodiments, the control bus port 700 may comprise two separate and distinct channels, for example one for receiving messages and the other for transmitting messages. In such embodiments one of the distinct channels may be coupled to terminal 200 and the other to terminal 300. Longitudinal and transverse signal transmission modes, and the means of AC coupling signals to power conductors, are known in the art of Power Line Communications (PLC) and are not described in detail herein.

Continuation in Part Disclosure

A battery module 10 (FIG. 1) may contain a large number of individual battery cells 400. In turn, a battery pack configured with a plurality of battery modules 10 may contain a combined total of several thousand individual battery cells 400. In embodiments of the present invention, a distinct circuit 950 (FIG. 2, FIG. 7, FIG. 17, FIG. 22) is associated with each of the cells 400. Those skilled in the art of battery module manufacturing shall appreciate that in such embodiments, the cost of each circuit 950 has a significant impact on the cost of the complete battery modules 10. It is therefore highly desirable to minimize the cost of both manufacture and installation of circuits 950 in order to reduce the finished cost of battery modules 10 and any battery pack comprised thereof.

As disclosed herein above and illustrated in FIG. 22 and FIG. 24, by utilizing AC coupling to communicatively couple the uplink port 990 and the downlink port 995 to the positive and the negative terminals of the associated battery cell 400, via coupling capacitors 985, it is possible to significantly reduce cost and complexity. The resulting battery cell assembly 405 (FIG. 22) eliminates unnecessary wiring by means of low cost PCBA 115 being assembled directly to the cell 400.

Figure 25:
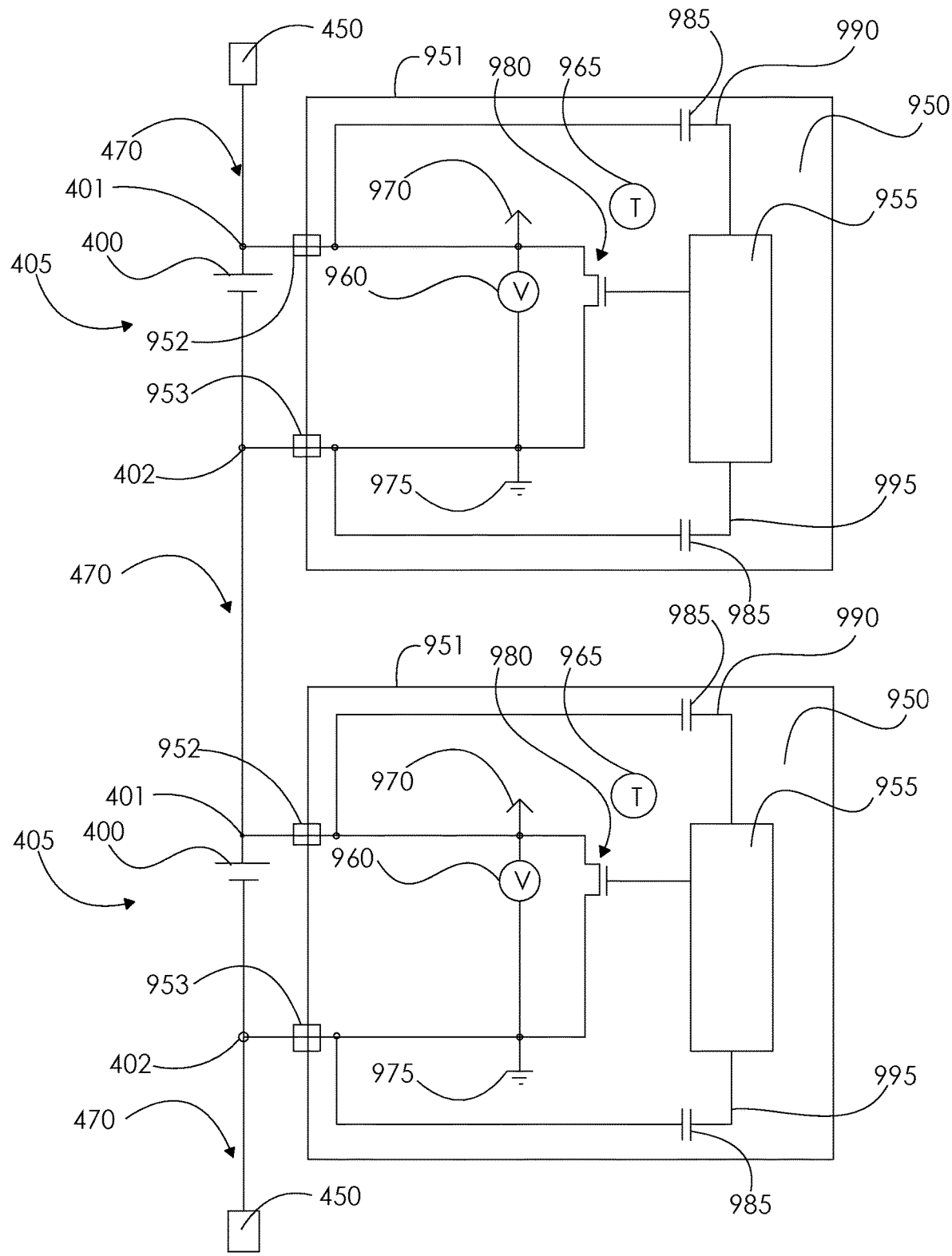
FIG. 25 illustrates low-cost battery cell monitoring and conditioning integrated circuits with on-chip A.C. coupling of uplink and downlink ports being coupled to a series of connected battery cells.
Figure 26:
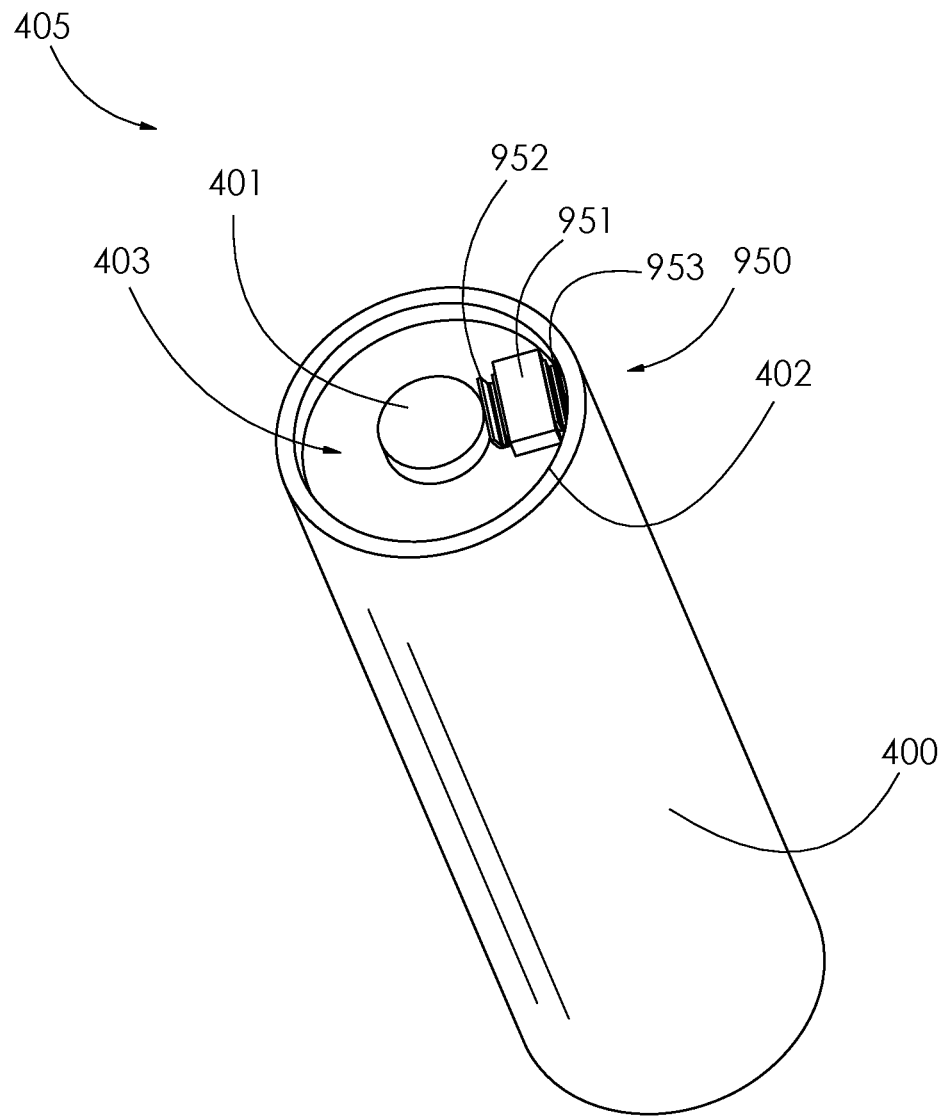
FIG. 26 is an orthogonal view illustration of a low-cost battery cell assembly comprising a battery cell and a battery cell monitoring and conditioning integrated circuit.

An illustrative embodiment of circuit 950 allowing further simplification and cost reduction is diagrammatically shown in FIG. 25, and the resulting cost-reduced battery cell assembly 405 is further illustrated in FIG. 26. An illustrative cross-sectional view of the cost-reduced battery cell assembly 405 is further shown in FIG. 27. In the illustrated embodiment, circuit 950 is implemented as an Integrated Circuit (IC). ICs are known in the art of electronic circuits and therefore the particulars of construction are not detailed herein.

The cost reduction in the illustrated embodiment is achieved by employing on-chip capacitors as coupling capacitors 985 (FIG. 25), eliminating the need for external components and the associated interconnections, and the PCBA 115. On-chip capacitors in some embodiments are formed as silicon or silicon-metal structures on the same silicon die (chip) that also comprises active electronic circuits, thereby eliminating the need for capacitors external to the die (chip).

The manufacturing steps of assembling the components to the PCBA 115 are also eliminated. Several types of on-chip capacitors for ICs are known in the arts of electronic circuit design, including but not limited to Metal-Insulator-Metal, Metal-Oxide-Metal, Metal Fringe, and Trench, and are not detailed herein. The use of on-chip capacitors in the illustrated IC 950 allows all components to be fully contained within the housing 951 of the circuit 950, and allows the use of only two leads for electrical connections to the circuit. In manufacturing the battery cell assembly 405 of the illustrated embodiment, the positive lead 952 is electrically coupled to the positive terminal 401 of the corresponding battery cell 400, and the negative lead 953 is electrically coupled to the negative terminal 402 of the corresponding battery cell 400, eliminating the need for a PCBA 115.

In some embodiments, the uplink port 990 may be communicatively coupled to the negative lead 953, and the downlink port 995 may correspondingly be communicatively coupled to the positive lead 952. All such modifications and variations are intended to be included herein within the scope of this disclosure and protected by the following claims.

Other types of on-chip AC coupling of the uplink port 990 and the downlink port 995 to the positive lead 952 and the negative lead 953 may be utilized without departing from the scope of the present invention.

FIG. 26 illustrates the physical coupling of the cost-reduced circuit 950 of the embodiment to a cylindrical battery cell 400. Methods of coupling the cost-reduced circuit 950 to other types of cells shall become apparent to those skilled in the art of battery module construction based on the disclosures made herein.

In FIG. 26 the housing 951 of the circuit 150 is sized so as to fit in the annular space 403 commonly found on cylindrical battery cells between the positive terminal 401 and the negative terminal 402 of the battery cell 400. In cylindrical battery cells, the outer shell typically serves as the negative terminal. To facilitate installation on some cylindrical cell types, the width of the housing 951 may be approximately 2 (two) millimeters. The positive lead 952 and the negative lead 953 of the circuit 950 are shown as extending outwardly from the housing 951, and at least one is a deformable metal pin.

Figure 27:
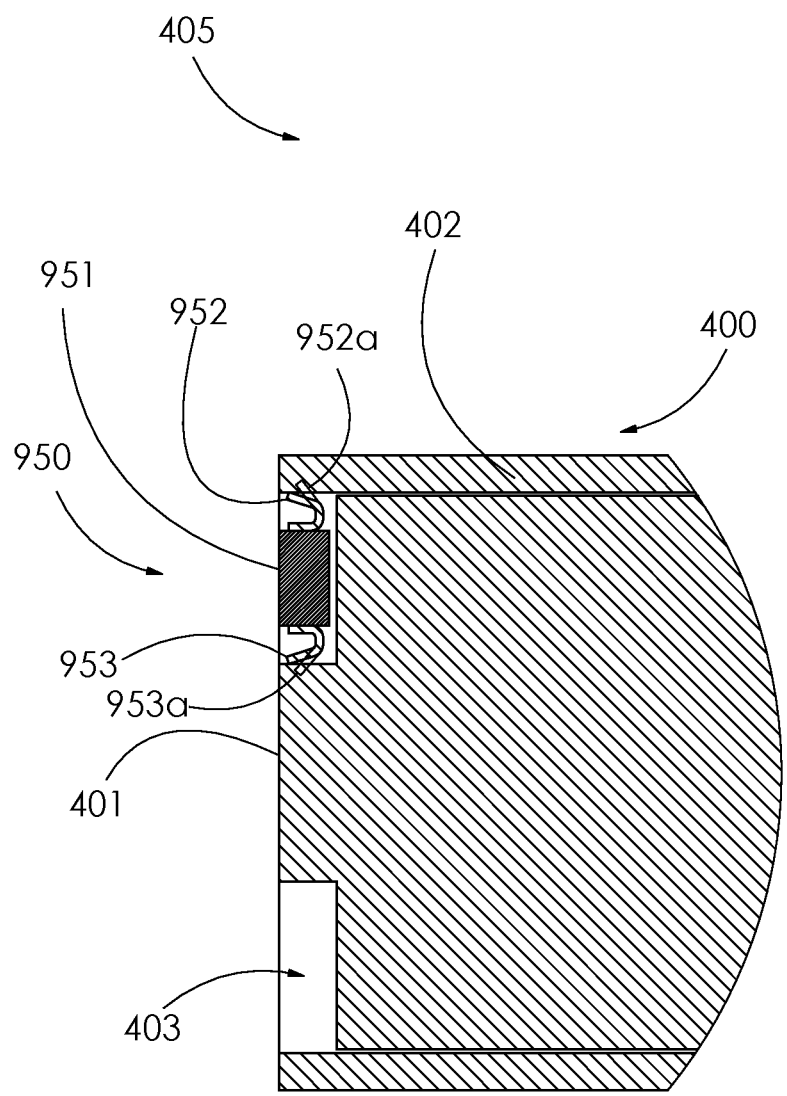
FIG. 27 is a cross-sectional view illustration of a low-cost battery cell assembly comprising a battery cell and a battery cell monitoring and conditioning integrated circuit.

The metal pins may be slightly deformed upon insertion of the housing 951 into the annular space 403, the positive lead 952 and the negative lead 953 thereby being electrically coupled to the positive cell terminal 401 and the negative cell terminal 402, respectively. In some embodiments, the deformation may be achieved by configuring the positive lead and the negative lead in such a way that the overall combined width of the IC 950 housing and the attached leads is slightly greater than that width of the annular space 403 of the battery cell 400. Deformation of the pins may be elastic or inelastic. FIG. 27 further illustrates example shapes of metal pins 952 and 953 prior to deformation, as profiles 952a and 953a respectively. The profiles illustrated in FIG. 27 are intended to show one of many possible embodiments and are not limiting. Other embodiments shall become apparent to those skilled in the art based on the disclosures made herein without departing from the scope of the present invention.

As illustrated in FIG. 27, the positive terminal 401 of the battery cell 400 extends outwardly from a center of a surface of the battery cell 400. The negative terminal 402 of the battery cell 400 extends outwardly from the surface of the battery cell along an outer edge circumference of the battery cell 400. Accordingly, the positive terminal 401 of the battery cell 400 and the negative terminal 402 of the battery cell 400 cooperatively define an annular space 403 above the surface of the battery cell. Here, each of the positive cell terminal 401 and the negative cell terminal 402 have sides that are exposed to facilitate electrical contact with the leads 952 and 953.

The deformation of the leads 952 and 953 from the illustrative un-deformed profiles 952a and 953a further ensures mechanical coupling of the housing 951 to the battery cell 400 since the deformation of the leads 952 and 953 creates a secure compression fit and/or frictional fit to the positive cell terminal 401 and the negative cell terminal 402 of the battery cell 400. Accordingly, the frictional fitting of the leads 952 and 953 into the annular space 403 allows for simple installation of circuit 950 on the battery cell 400 to manufacture the cell assembly 405 without the need for soldering, welding, or wire bonding operations. Here, a technician or a machine may slidably insert the housing 951 into the annular space 403 of the battery cell 400. Accordingly, any legacy battery cell 400 may be coupled to the housing 951. Preferably, the thickness of the housing 951 is less than, or is at least equal to, the depth of the annular space 403. The mechanical coupling illustrating the frictional fit of the positive cell terminal 401 and the negative cell terminal 402 into the annular space 403 of the battery cell 400 is further illustrated in cross-sectional view of FIG. 27. Encapsulation of the housing 951 may further be used in some embodiments to improve mechanical robustness, reliability and thermal performance of the cell assembly 405. Encapsulation is known in the arts of electronic circuit manufacturing and is not detailed herein.

In alternative embodiments, the housing 951 may provide other electronic circuitry configured to perform other operations or functions not disclosed herein. For example, but not limited to, battery state and/or condition information may be acquired by electronic circuitry, such as a microcontroller, residing in the housing 951. A transceiver residing in the housing 951 may communicate the acquired information to another remote electronic device using a suitable wireless signal communication format, such as a low power and/or near-field communication system. An example near-field communication is Bluetooth. Any suitable low power and/or near-field communication system now known or later developed may be used in the various embodiments, and the operation of the transceiver may be powered by the battery cell 400. Accordingly, embodiments of the housing 951 employing the leads 952 and 953 that are secured to the positive cell terminal 401 and the negative cell terminal 402 of a battery cell 400 may be used with any electronic device now known or later developed that employs one or more battery cells 400 as a power source.

The simplification and cost reduction of the circuits and components disclosed herein are made possible by the unique and novel configuration of the circuit 950 of the present invention.

It should be emphasized that the above-described embodiments of the battery module 10, the battery cell assembly 405, and the battery cell monitoring and conditioning circuit 950 are merely possible examples of implementations of the invention. Many variations and modifications may be made to the above-described embodiments. All such modifications and variations are intended to be included herein within the scope of this disclosure and protected by the following claims.

Furthermore, the disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower, or equal in scope to the original claims, are to be considered within the subject matter of the inventions described herein.

Therefore, having thus described the invention, what is claimed is:

1. A method of operating a battery cell monitoring and conditioning Integrated Circuit (IC) for a battery cell, said monitoring and conditioning IC comprising a controller, an uplink port for receiving command messages and transmitting response messages by the controller, a downlink port for transmitting command messages and receiving response messages by the controller, said downlink port being distinct and separate from said uplink port, a positive lead, said positive lead being configured to be electrically coupled to a positive terminal of the battery cell, a negative lead, said negative lead being configured to be electrically coupled to a negative terminal of the battery cell, wherein said uplink port is communicatively coupled to one of said positive lead and said negative lead, and wherein said downlink port is communicatively coupled to the other of said positive lead and said negative lead, said method comprising the steps of:
    waiting to receive a command message via the uplink port;
    receiving a command message via the uplink port after said waiting;
    transmitting the command message via the downlink port in response to receiving the command message via the uplink port;
    executing a command specified in the received command message;
    preparing a prepared response message;
    transmitting the prepared response message via the uplink port and repeating the step of waiting to receive a command message via the uplink port.

2. The method of claim 1, further comprising the steps of:
    waiting to receive a response message via the downlink port;
    receiving a new response message via the downlink port after said waiting;
    responsive to receiving the new response message, transmitting the new response message via the uplink port and repeating the step of waiting to receive a response message via the downlink port.

3. The method of claim 1, said battery cell monitoring and conditioning IC being coupled to a battery cell, said battery cell having a positive terminal and a negative terminal, said positive lead being electrically coupled to the positive terminal of the battery cell, and said negative lead being electrically coupled to the negative terminal of the battery cell.

* * * * *